(12) United States Patent
Lee

(10) Patent No.: US 10,910,395 B2
(45) Date of Patent: Feb. 2, 2021

(54) METHODS OF FORMING SEMICONDUCTOR DEVICE STRUCTURES

(71) Applicant: Micron Technology, Inc., Boise, ID (US)

(72) Inventor: Eric N. Lee, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/202,999

(22) Filed: Nov. 28, 2018

(65) Prior Publication Data

US 2019/0139977 A1   May 9, 2019

Related U.S. Application Data

(62) Division of application No. 15/058,921, filed on Mar. 2, 2016, now Pat. No. 10,373,970.

(51) Int. Cl.

| | |
|---|---|
| *H01L 27/11575* | (2017.01) |
| *H01L 23/528* | (2006.01) |
| *H01L 27/11548* | (2017.01) |
| *H01L 27/11526* | (2017.01) |
| *H01L 27/11573* | (2017.01) |
| *H01L 27/11556* | (2017.01) |
| *H01L 27/11582* | (2017.01) |
| *H01L 21/764* | (2006.01) |
| *H01L 27/11524* | (2017.01) |
| *H01L 27/1157* | (2017.01) |

(52) U.S. Cl.
CPC ...... *H01L 27/11575* (2013.01); *H01L 21/764* (2013.01); *H01L 23/5283* (2013.01); *H01L 27/1157* (2013.01); *H01L 27/11524* (2013.01); *H01L 27/11526* (2013.01); *H01L 27/11548* (2013.01); *H01L 27/11556* (2013.01); *H01L 27/11573* (2013.01); *H01L 27/11582* (2013.01)

(58) Field of Classification Search
CPC ........ H01L 27/11514; H01L 27/11551–11556; H01L 27/11578–11582
See application file for complete search history.

(56) References Cited

U.S. PATENT DOCUMENTS

| | | |
|---|---|---|
| 6,141,250 A | 10/2000 | Kashimura |
| 7,852,676 B2 | 12/2010 | Maejima |
| 8,284,601 B2 | 10/2012 | Son et al. |
| 8,405,142 B2 | 3/2013 | Katsumata et al. |

(Continued)

*Primary Examiner* — Jesse Y Miyoshi
(74) *Attorney, Agent, or Firm* — TraskBritt

(57) ABSTRACT

A semiconductor device structure comprises stacked tiers each comprising at least one conductive structure and at least one insulating structure longitudinally adjacent the at least one conductive structure, at least one staircase structure having steps comprising lateral ends of the stacked tiers, and at least one opening extending through the stacked tiers and continuously across an entire length of the at least one staircase structure. The at least one conductive structure of each of the stacked tiers extends continuously from at least one of the steps of the at least one staircase structure and around the at least one opening to form at least one continuous conductive path extending completely across each of the stacked tiers. Additional semiconductor device structures, methods of forming semiconductor device structures, and electronic systems are also described.

8 Claims, 17 Drawing Sheets

(56) References Cited

U.S. PATENT DOCUMENTS

| | | | |
|---|---|---|---|
| 8,530,350 B2 | 9/2013 | Freeman et al. | |
| 8,609,536 B1 | 12/2013 | Ha et al. | |
| 8,614,917 B2 | 12/2013 | Shim et al. | |
| 8,796,778 B2 | 8/2014 | Tanzawa | |
| 9,397,043 B1* | 7/2016 | Minemura | H01L 27/11582 |
| 2009/0268522 A1 | 10/2009 | Maejima | |
| 2009/0268523 A1 | 10/2009 | Maejima | |
| 2009/0310415 A1 | 12/2009 | Jin et al. | |
| 2011/0092038 A1 | 4/2011 | Choi et al. | |
| 2011/0244666 A1 | 10/2011 | Kim et al. | |
| 2012/0091413 A1 | 4/2012 | Nguyen et al. | |
| 2012/0119287 A1 | 5/2012 | Park et al. | |
| 2012/0170368 A1 | 7/2012 | Lee et al. | |
| 2012/0280299 A1* | 11/2012 | Yun | H01L 27/1157 257/314 |
| 2012/0306089 A1* | 12/2012 | Freeman | H01L 27/11556 257/773 |
| 2013/0146980 A1 | 6/2013 | Tanzawa | |
| 2014/0061747 A1 | 3/2014 | Tanzawa et al. | |
| 2014/0138840 A1 | 5/2014 | Ha et al. | |
| 2014/0241026 A1 | 8/2014 | Tanzawa | |
| 2014/0347929 A1 | 11/2014 | Tanzawa | |
| 2015/0001613 A1 | 1/2015 | Yip et al. | |
| 2016/0233229 A1 | 8/2016 | Oh et al. | |

\* cited by examiner

METHODS OF FORMING SEMICONDUCTOR DEVICE STRUCTURES

CROSS-REFERENCE TO RELATED APPLICATION

This application is a divisional of U.S. patent application Ser. No. 15/058,921, filed Mar. 2, 2016, now U.S. Pat. No. 10,373,970, issued Aug. 6, 2019, the disclosure of which is hereby incorporated herein in its entirety by this reference.

TECHNICAL FIELD

The disclosure, in various embodiments, relates generally to the field of semiconductor device design and fabrication. More specifically, the disclosure relates to semiconductor device structures including staircase structures, and to related methods and electronic systems.

BACKGROUND

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes semiconductor pillars extending through openings in tiers of conductive structures (e.g., word line plates, control gate plates) and dielectric materials at each junction of the semiconductor pillars and the conductive structures. Such a configuration permits a greater number of switching devices (e.g., transistors) to be located in a unit of die area by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming a so-called "staircase" or "stair step" structure at edges of the tiers of conductive structures. The staircase structure includes individual "steps" defining contact regions of the conductive structures upon which contact structures can be positioned to provide electrical access to the conductive structures. Unfortunately, conventional staircase structure fabrication techniques can segment one or more conductive structures of a given tier, resulting in discontinuous conductive paths through the tier that can require the use of multiple (e.g., more than one) switching devices to drive voltages completely across the tier and/or in opposing directions across the tier.

There remains a need for new semiconductor device structures, such as memory array blocks for 3D non-volatile memory devices (e.g., 3D NAND Flash memory devices), as well as for associated memory devices and electronic systems including the semiconductor device structures, and simple, cost-efficient methods of forming semiconductor device structures.

DETAILED DESCRIPTION

Figure 1A:
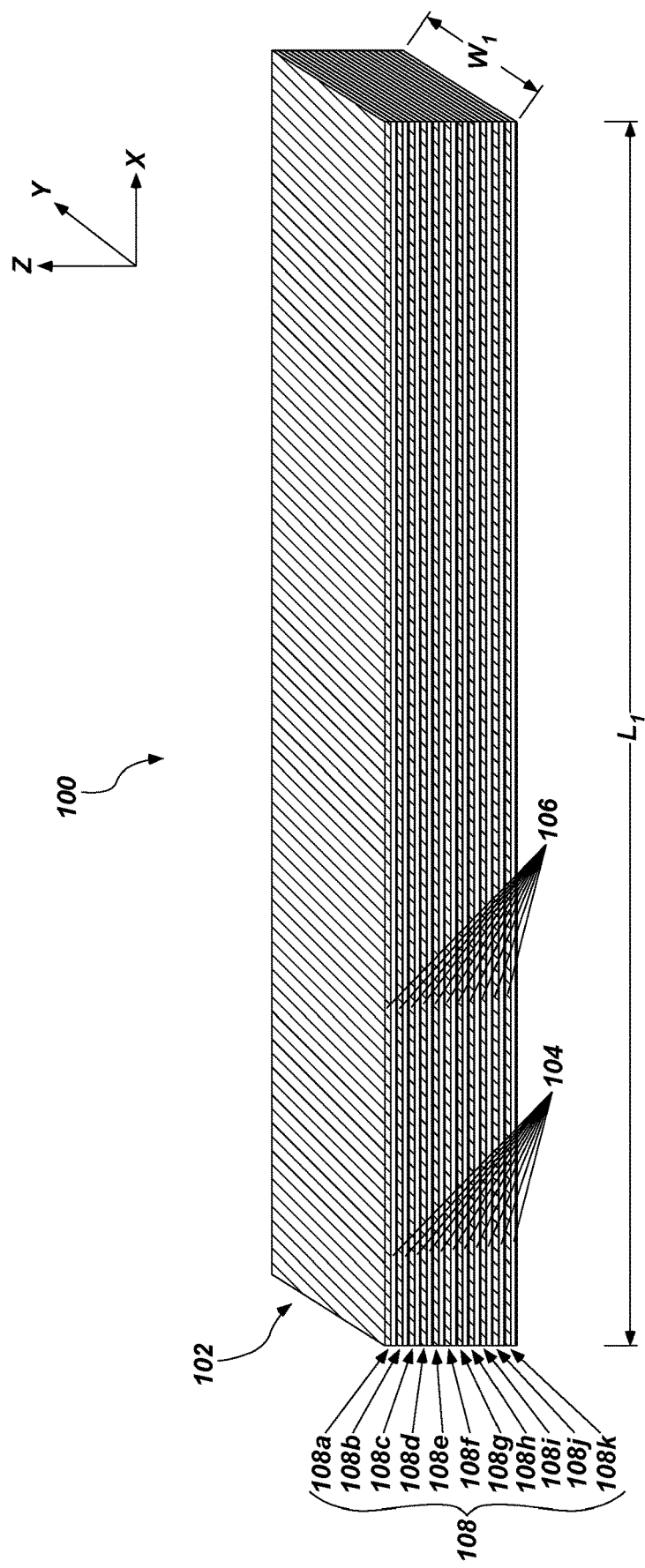
FIGS. 1A through 1G are perspective (FIGS. 1A through 1F) and top-down (FIG. 1G) views illustrating a method of forming a semiconductor device structure, in accordance with embodiments of the disclosure.

Semiconductor device structures (e.g., memory array blocks) including staircase structures are described, as are related methods and electronic systems. In some embodiments, a semiconductor device structure includes stacked tiers each including at least one conductive structure and at least one insulating structure longitudinally adjacent the at least one conductive structure, one or more staircase structures including steps defined by lateral ends of the stacked tiers, and one or more openings extending through the stacked tiers and continuously across an entire length of the at least one staircase structure. The conductive structure of each of the stacked tiers may extend continuously from at least one of the steps of the at least one staircase structure and around the opening (e.g., around ends and one or more sides of the opening) to form a continuous conductive path extending completely across each of the stacked tiers. In additional embodiments, a semiconductor device structure formed in accordance with the methods of the disclosure includes stacked tiers each including conductive structures and insulating structures longitudinally adjacent the conductive structures, stadium structures each including opposing staircase structures having steps defined by lateral ends of the stacked tiers, at least one opening laterally intervening between at least two of the stadium structures and extending through the stacked tiers and continuously across entire lengths of the at least two stadium structures, conductive contact structures coupled to the conductive structures of the stacked tiers at steps of the opposing staircase structures of at least one of the stadium structures, and conductive routing structures coupled to and extending completely between pairs of the conductive contact structures to form at least one continuous conductive path extending completely across each of the stacked tiers. The structures and methods of the disclosure may permit individual (e.g., single) switching devices (e.g., transistors) of at least one string driver device electrically connected to one or more conductive structures of an individual tier to drive voltages completely across and/or in opposing directions across the tier. The structures and methods of the disclosure may decrease the number of switching devices and interconnections required to effectively operate a memory device, and may increase one or more of memory device performance, scalability, efficiency, and simplicity as compared to many conventional structures and methods.

The following description provides specific details, such as material compositions and processing conditions, in order to provide a thorough description of embodiments of the present disclosure. However, a person of ordinary skill in the art would understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device (e.g., a memory device). The semiconductor device structures described below do not form a complete semiconductor device. Only those process acts and structures necessary to understand the embodiments of the present disclosure are described in detail below. Additional acts to form a complete semiconductor device from the semiconductor device structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the terms "vertical", "longitudinal", "horizontal", and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct ohmic connection or through an indirect connection (e.g., via another structure).

As used herein, the term "mirrors" means and includes that at least two structures are mirror images of one another. As a non-limiting example, a first staircase structure that mirrors a second staircase structure may exhibit the substantially the same size and substantially the same shape as the second staircase structure, but may outwardly extend in a direction that opposes a direction in which the second structure outwardly extends. The first staircase structure may, for example, exhibit a generally negative slope, and the second staircase structure may exhibit a generally positive slope.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

FIGS. 1A through 1G are simplified perspective (FIGS. 1A through 1F) and top-down (FIG. 1G) views illustrating embodiments of a method of forming a semiconductor device structure including a staircase structure, such as a memory array structure (e.g., a memory array block) for a 3D non-volatile memory device (e.g., a 3D NAND Flash memory device). With the description provided below, it will be readily apparent to one of ordinary skill in the art that the methods described herein may be used in various devices. In other words, the methods of the disclosure may be used whenever it is desired to form a semiconductor device including a staircase structure.

Referring to FIG. 1A, a semiconductor device structure 100 may include a stack structure 102 exhibiting an alternating sequence of insulating structures 104 and additional insulating structures 106 arranged in tiers 108. Each of the tiers 108 may include one of the insulating structures 104 and one of the additional insulating structures 106. For clarity and ease of understanding of the drawings and related description, FIG. 1A shows the stack structure 102 as including eleven (11) tiers 108 (i.e., tiers 108a through 108k) of the insulating structures 104 and the additional insulating structures 106. However, the stack structure 102 may include a different number of tiers 108. For example, in additional embodiments, the stack structure 102 may include greater than eleven (11) tiers 108 (e.g., greater than or equal to fifteen (15) tiers 108, greater than or equal to twenty-five

(25) tiers 108, greater than or equal to fifty (50) tiers 108, greater than or equal to one hundred (100) tiers 108) of the insulating structures 104 and the additional insulating structures 106, or may include less than eleven (11) tiers 108 (e.g., less than or equal to ten (10) tiers 108, less than or equal to five (5) tiers 108, less than or equal to three (3) tiers 108) of the insulating structures 104 and the additional insulating structures 106.

The insulating structures 104 may be formed of and include at least one insulating material, such as one or more of an oxide material (e.g., silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or a combination thereof), a nitride material (e.g., silicon nitride), an oxynitride material (e.g., silicon oxynitride), and amphorous carbon. Each of the insulating structures 104 may independently include a substantially homogeneous distribution or a substantially heterogeneous distribution of the at least one insulating material. In some embodiments, each of the insulating structures 104 exhibits a substantially homogeneous distribution of insulating material. In additional embodiments, at least one of the insulating structures 104 exhibits a substantially heterogeneous distribution of at least one conductive material. One or more of the insulating structures 104 may, for example, be formed of and include a stack (e.g., laminate) of at least two different insulating materials. In some embodiments, each of the insulating structures 104 is formed of and includes silicon dioxide. The insulating structures 104 may each be substantially planar, and may each independently exhibit any desired thickness. In addition, each of the insulating structures 104 may be substantially the same (e.g., exhibit substantially the same material composition, material distribution, size, and shape) as one another, or at least one of the insulating structures 104 may be different (e.g., exhibit one or more of a different material composition, a different material distribution, a different size, and a different shape) than at least one other of the insulating structures 104. In some embodiments, each of the insulating structures 104 is substantially the same as each other of the insulating structures 104.

The additional insulating structures 106 may each be formed of and include at least one additional insulating material that may be selectively removable relative to the insulating material of the insulating structures 104. The at least one additional insulating material of the additional insulating structures 106 may be different than the insulating material of the insulating structures 104, and may comprise one or more of an oxide material (e.g., silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or combinations thereof), a nitride material (e.g., silicon nitride), an oxynitride material (e.g., silicon oxynitride), and amphorous carbon. Each of the additional insulating structures 106 may independently include a substantially homogeneous distribution or a substantially heterogeneous distribution of the at least one additional insulating material. In some embodiments, each of the additional insulating structures 106 exhibits a substantially homogeneous distribution of additional insulating material. In further embodiments, at least one of the additional insulating structures 106 exhibits a substantially heterogeneous distribution of at least one conductive material. One or more of the additional insulating structures 106 may, for example, be formed of and include a stack (e.g., laminate) of at least two different additional insulating materials. In some embodiments, each of the additional insulating structures 106 is formed of and includes silicon nitride. The additional insulating structures 106 may each be substantially planar, and may each independently exhibit any desired thickness. In addition, each of the additional insulating structures 106 may be substantially the same (e.g., exhibit substantially the same material composition, material distribution, size, and shape) as one another, or at least one of the additional insulating structures 106 may be different (e.g., exhibit one or more of a different material composition, a different material distribution, a different size, and a different shape) than at least one other of the additional insulating structures 106. In some embodiments, each of the additional insulating structures 106 is substantially the same as each other of the additional insulating structures 106. The additional insulating structures 106 may serve as sacrificial structures for the subsequent formation of conductive structures, as described in further detail below.

As shown in FIG. 1A, in some embodiments, the alternating sequence of the insulating structures 104 and the additional insulating structures 106 begins with one of the insulating structures 104. In additional embodiments, the insulating structures 104 and the additional insulating structures 106 exhibit a different arrangement relative to one another. By way of non-limiting example, the insulating structures 104 and the additional insulating structures 106 may be arranged in an alternating sequence beginning with one of the additional insulating structures 106. In some embodiments, each of the tiers 108 includes one of the additional insulating structures 106 on or over one of the insulating structures 104. In additional embodiments, each of the tiers 108 includes one of the insulating structures 104 on or over one of the additional insulating structures 106.

The stack structure 102, including the each of the tiers 108 thereof, may be formed using conventional processes (e.g., conventional deposition processes, conventional material removal processes) and conventional processing equipment, which are not described in detail herein. By way of non-limiting example, the insulating structures 104 and the additional insulating structures 106 may be formed through one or more of in situ growth, spin-on coating, blanket coating, chemical vapor deposition (CVD), plasma enhanced chemical vapor deposition (PECVD), atomic layer deposition (ALD), and physical vapor deposition (PVD).

Figure 1B:
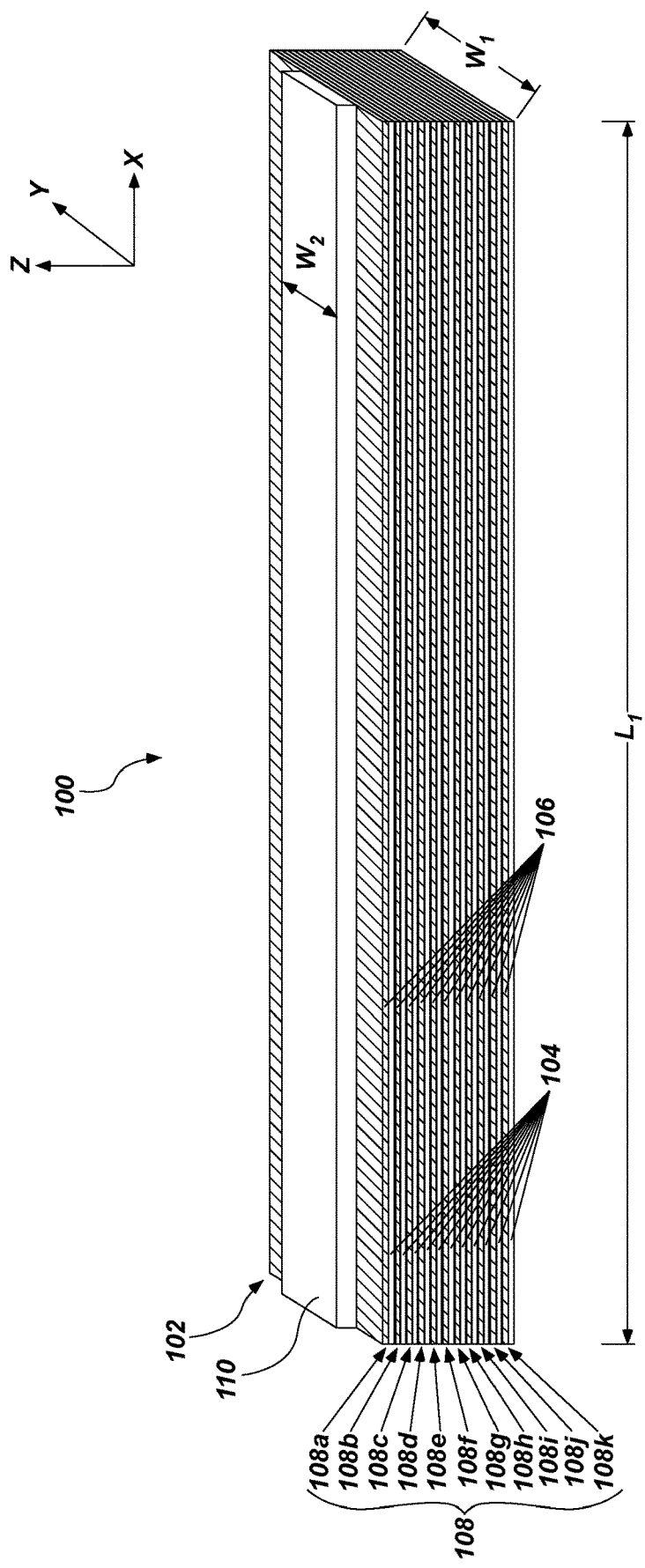

Referring next to FIG. 1B, a masking structure 110 may be formed on or over the stack structure 102. The masking structure 110 may be formed of and include at least one material (e.g., at least one hard mask material) suitable for use as an etch mask to pattern portions of the stack structure 102 (e.g., portions of the tiers 108, including portions of the insulating structures 104 and portions of the additional insulating structures 106, remaining uncovered by the masking structure 110) to form at least one staircase structure, as described in further detail below. By way of non-limiting example, the masking structure 110 may be formed of and include at least one of amorphous carbon, silicon, a silicon oxide, a silicon nitride, a silicon oxycarbide, aluminum oxide, and a silicon oxynitride. The masking structure 110 may be homogeneous (e.g., may comprise a single material layer), or may be heterogeneous (e.g., may comprise a stack exhibiting at least two different material layers).

The position and dimensions of the masking structure 110 may be selected at least partially based on desired positions and desired dimensions of one or more staircase structures to be subsequently formed in the stack structure 102. By way of non-limiting example, as shown in FIG. 1B, the masking structure 110 may be centrally positioned on or over the stack structure 102 in the Y-direction, may have a width $W_2$ less than the width $W_1$ of the stack structure 102, and may have substantially the same length $L_1$ as the stack structure 102. Widths of portions of the stack structure 102 remaining uncovered by (e.g., not underlying) the masking structure 110 may correspond to widths of the one or more staircase structures to be subsequently formed in the stack structure 102. In additional embodiments, the masking structure 110 may exhibit one or more of a different position (e.g., a different position in one or more of the X-direction and the Y-direction), a different width $W_2$, and a different length (e.g., a length less than the length $L_1$). As a non-limiting example, the masking structure 110 may be centrally positioned on or over the stack structure 102 in each of the Y-direction and the X-direction, may have a width $W_2$ less than the width $W_1$ of the stack structure 102, and may have a length less than the length $L_1$ of the stack structure 102. As another non-limiting example, the masking structure 110 may be non-centrally positioned over the stack structure 102 in the Y-direction, may have a width $W_2$ less than the width $W_1$ of the stack structure 102, and may have substantially the same length $L_1$ as the stack structure 102. The masking structure 110 may be formed on or over the stack structure 102 to any desired thickness.

The masking structure 110 may be formed using conventional processes (e.g., conventional deposition processes, such as at least one of in situ growth, spin-on coating, blanket coating, CVD, PECVD, ALD, and PVD, conventional photolithography processes, conventional material removal processes) and conventional processing equipment, which are not described in detail herein.

Figure 1C:
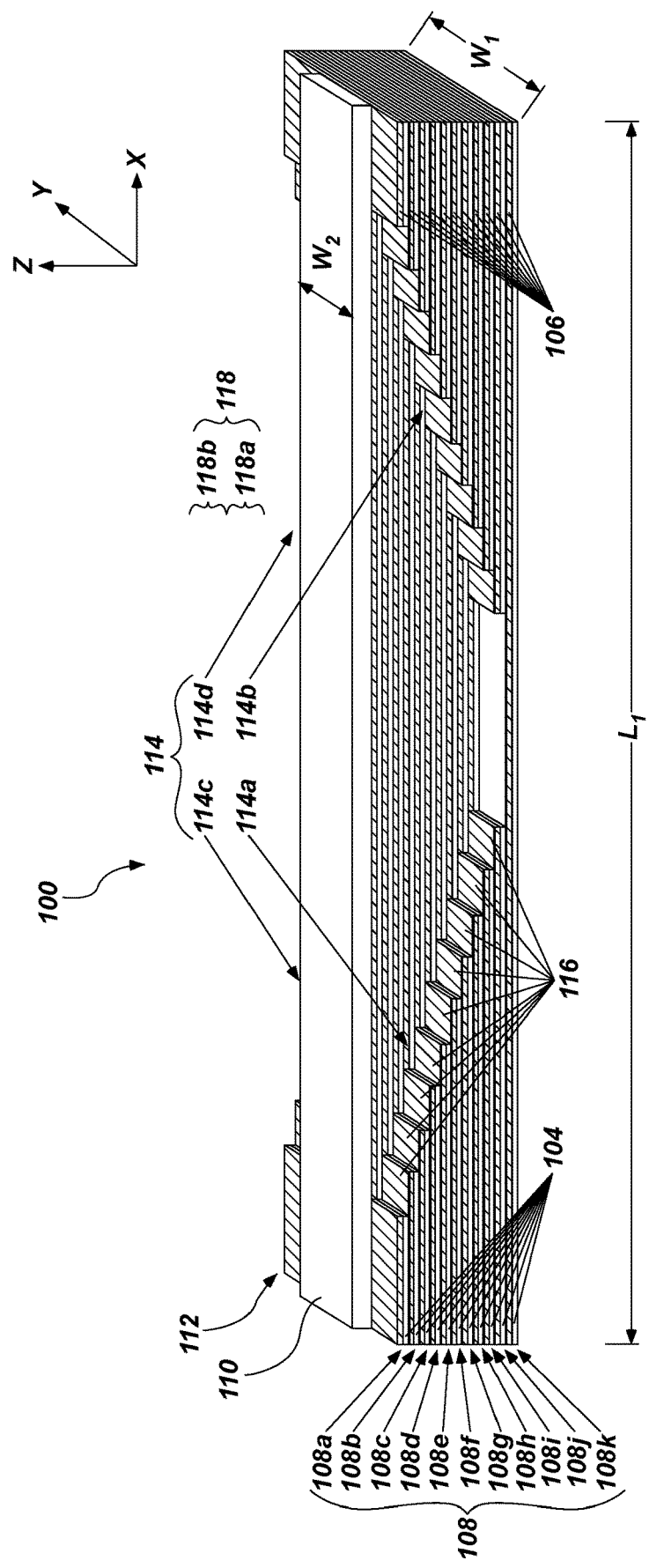

Referring to next to FIG. 1C, portions of the stack structure 102 (FIG. 1B) (e.g., portions of one or more of the tiers 108) remaining uncovered by the masking structure 110 may be subjected to at least one material removal process (e.g., one or more of a trimming process and a chopping process) to form a modified stack structure 112. The modified stack structure 112 may include one or more staircase structures 114 each independently formed of and including one or more steps 116. The steps 116 of the one or more staircase structures 114 may be at least partially defined by exposed portions of one or more of the tiers 108 remaining following the at least one material removal process.

The modified stack structure 112 may include a single (e.g., only one) staircase structure 114, or may include multiple (e.g., more than one) staircase structures 114. In some embodiments, the modified stack structure 112 includes multiple staircase structures 114. By way of non-limiting example, as shown in FIG. 1C, the modified stack structure 112 may include one or more so-called stadium structures 118 each including opposing staircase structures 114. A first stadium structure 118a may be positioned along one side of the masking structure 110, and a second stadium structure 118b may be positioned along an opposing side of the masking structure 110. The first stadium structure 118a may include a first forward staircase structure 114a, and a first reverse staircase structure 114b that mirrors the first forward staircase structure 114a. The second stadium structure 118b may extend parallel to the first stadium structure 118a (e.g., the first stadium structure 118a and the second stadium structure 118b may both extend in the X-direction), and may include a second forward staircase structure 114c, and a second reverse staircase structure 114d that mirrors the second forward staircase structure 114c. The first stadium structure 118a and the second stadium structure 118b may be substantially similar to one another (e.g., may exhibit substantially the same shapes and sizes as one another), or may be different than one another (e.g., may exhibit one or more of different shapes and different sizes than one another). In some embodiments, the first stadium structure 118a and the second stadium structure 118b are substantially similar to one another. The first stadium structure 118a and the second stadium structure 118b may serve as redundant and/or alternative means of connecting to one or more of the tiers 108 of the modified stack structure 112, as may the opposing staircase structures (e.g., the first forward staircase structure 114a and the first reverse staircase structure 114b of the first stadium structure 118a, and/or the second forward staircase structure 114c and the second reverse staircase structure 114d of the second stadium structure 118b) of one or more of the first stadium structure 118a and the second stadium structure 118b.

In additional embodiments, the modified stack structure 112 may exhibit one or more of a different number and different configuration of the staircase structures 114. By way of non-limiting example, the modified stack structure 112 may include only one (1) stadium structure 118 (e.g., only the first stadium structure 118a, or only the second stadium structure 118b), may include more than two (2) stadium structures 118 extending parallel to one another, may include two or more stadium structures 118 extending in series with one another, may include one or more forward staircase structures (e.g., one or more of the first forward staircase structure 114a and the second forward staircase structure 114c) but not one or more reverse staircase structures (e.g., one or more of the first reverse staircase structure 114b and the second reverse staircase structure 114d may be omitted), may include one or more reverse staircase structures (e.g., one or more of the first reverse staircase structure 114b and the second reverse staircase structure 114d) but not one or more forward staircase structures (e.g., one or more of the first forward staircase structure 114a and the second forward staircase structure 114c may be omitted), may include two or more forward staircase structures extending in series with one another, and/or may include two or more reverse staircase structures extending in series with one another.

Each of the staircase structures 114 included in the modified stack structure 112 may independently include a desired number of steps 116. The number of steps 116 included in each of the staircase structures 114 may be substantially the same as (e.g., equal to) or may be different than (e.g., less than, or greater than) the number of tiers 108 in the modified stack structure 112. In some embodiments, the number of steps 116 included in each of the staircase structures 114 is less than the number of tiers 108 in the modified stack structure 112. As a non-limiting example, as shown in FIG. 1C, each of the staircase structures 114 (e.g., the first forward staircase structure 114a, the first reverse staircase structure 114b, the second forward staircase structure 114c, and the second reverse staircase structure 114d) may include ten (10) steps 116 at least partially defined by ends of the eleven (11) tiers 108 (e.g., tiers 108a through 108k) of the modified stack structure 112. In additional embodiments, one or more of the staircase structures 114 may include a different number of steps 116 (e.g., less than ten (10) steps 116, greater than ten (10) steps 116). By way of non-limiting example, if the modified stack structure 112 includes eleven (11) tiers 108, at least one of the staircase structures 114 may include five (5) steps 116 at least partially defined by ends of a relatively lower group of the tiers 108 (e.g., tier 108f through tier 108k), and at least one other of the staircase structures 114 may include five (5) steps 116 at least partially defined by ends of a relatively higher group of the tiers 108 (e.g., tiers 108a through 108e).

The dimensions of each of the steps 116 may independently be tailored to desired dimensions and positions of additional structures (e.g., conductive structures, conductive contact structures) and/or openings (e.g., slots) to be formed in, on, over, and/or adjacent to the steps 116 during subsequent processing of the semiconductor device structure 100, as described in further detail below. In some embodiments, each of the steps 116 exhibits substantially the same dimensions (e.g., substantially the same width, substantially the same length, and substantially the same height) as each other of the steps 116. In additional embodiments, at least one of the steps 116 exhibits different dimensions (e.g., one or more of a different width, a different length, and a different height) than at least one other of the steps 116.

The staircase structures 114 may be formed using conventional processes (e.g., conventional photolithography processes, conventional material removal processes) and conventional processing equipment, which are not described in detail herein. By way of non-limiting example, a photoresist structure may be formed on or over at least uncovered portions of the stack structure 102 (FIG. 1B), the photoresist structure may be photolithographically processed (e.g., photoexposed and developed) to remove at least one width thereof, one or more of the tiers 108 may be etched (e.g., anisotropically etched, such as anisotropically dry etched) using the masking structure 110 and remaining portions of the photoresist structure as etching masks, the photoresist structure may be subjected to additional photolithographic processing to remove at least one additional width thereof, at least another group of the tiers 108 (e.g., previously etched tiers 108 and one or more additional tiers 108) may be etched using the masking structure 110 and newly remaining portions of the photoresist structure as etching masks, and so on, until the modified stack structure 112 including the one or more staircase structures 114 is formed.

Figure 1D:
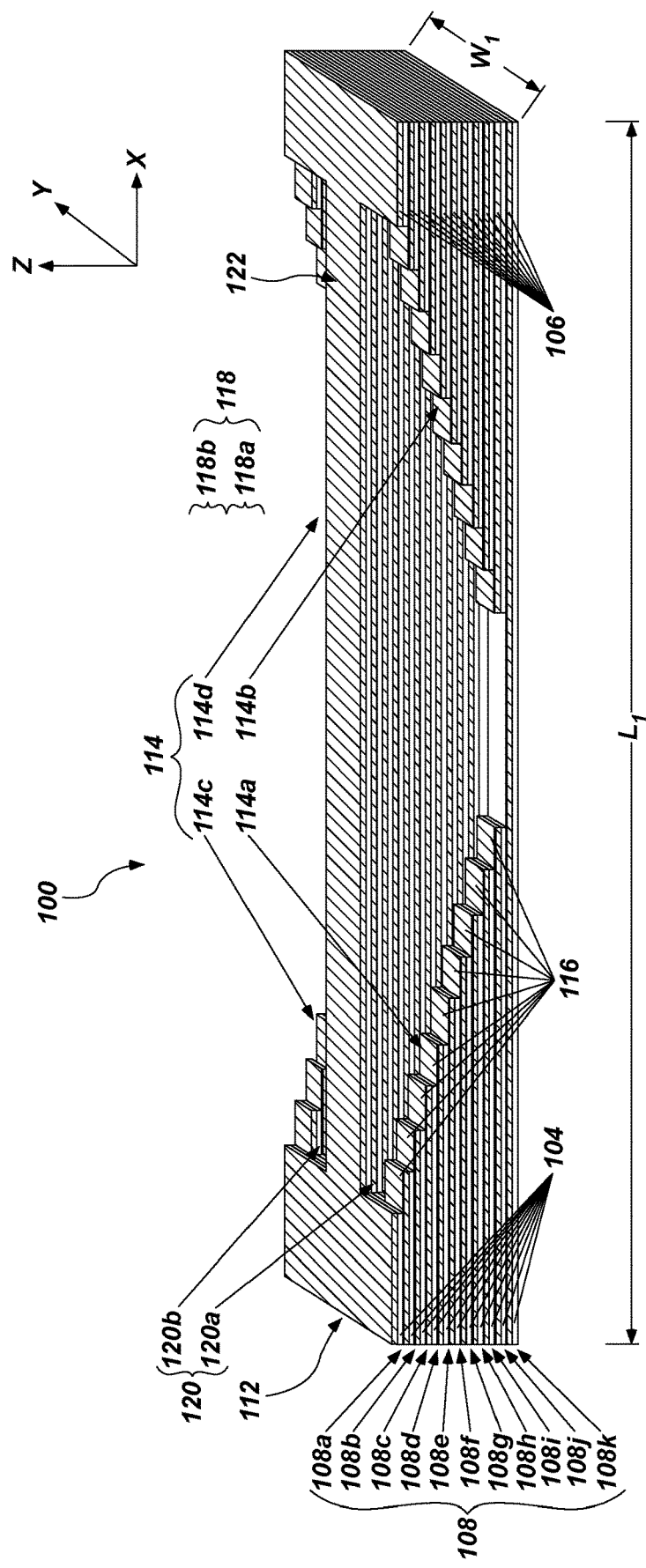

Referring next to FIG. 1D, the masking structure 110 (FIG. 1C) may be removed, and one or more openings 120 (e.g., slots, apertures, slits) may be formed in the modified stack structure 112. The masking structure 110 may be removed using one or more conventional material removal processes, which are not described in detail herein. By way of non-limiting example, the masking structure 110 may be selectively removed through at least one conventional etching process (e.g., a conventional wet etching process, a conventional dry etching process).

The openings 120 may longitudinally extend (e.g., in the Z-direction) through (e.g., completely through) the modified stack structure 112, may be positioned laterally inward (e.g., in the Y-direction) of the staircase structures 114, and may continuously laterally extend (e.g., in the X-direction) across the entire lengths of the staircase structures 114. By way of non-limiting example, as shown in FIG. 1D, the openings 120 may extend completely through each of the tiers 108, may be positioned laterally inwardly adjacent the stadium structures 118, and may continuously laterally extend across the entire lengths of the stadium structures 118. A first opening 120a may be positioned laterally between (e.g., in the Y-direction) the first stadium structure 118a and a remaining middle section 122 of the modified stack structure 112, and may laterally extend (e.g., in the X-direction) from a top (e.g., a laterally inward end of tier 108a) of the first forward staircase structure 114a to a top (e.g., an opposing laterally inward end of tier 108a) of the first reverse staircase structure 114b. A second opening 120b may be positioned laterally between (e.g., in the Y-direction) the second stadium structure 118b and the remaining middle section 122 of the modified stack structure 112, and may laterally extend parallel (e.g., in the X-direction) to the first opening 120a from a top (e.g., a laterally inward end of tier 108a) of the second forward staircase structure 114c to a top (e.g., an opposing laterally inward end of tier 108a) of the second reverse staircase structure 114d.

In additional embodiments, one or more of the openings 120 may exhibit a different configuration than that depicted in FIG. 1D. As a non-limiting example, in embodiments wherein the modified stack structure 112 includes at least one forward staircase structure (e.g., the first forward staircase structure 114a, and/or the second forward staircase structure 114c) but not at least one reverse staircase structure (e.g., not at least one of the first reverse staircase structure 114b and the second reverse staircase structure 114d) opposing the forward staircase structure, the opening 120 may be positioned laterally inward (e.g., laterally adjacent) the forward staircase structure and may longitudinally extend completely through the tiers 108, but may continuously laterally extend from a top (e.g., a laterally inward end of the tier 108a) of the forward staircase structure to a bottom (e.g., as defined by one or more of the tier 108k and the tier 108j) of the forward staircase structure. As another non-limiting example, in embodiments wherein the modified stack structure 112 includes at least one reverse staircase structure (e.g., the first reverse staircase structure 114b, and/or the second reverse staircase structure 114d) but not at least one forward staircase structure (e.g., not at least one of the first forward staircase structure 114a and the second forward staircase structure 114c) opposing the reverse staircase structure, the opening 120 may be positioned laterally inward (e.g., laterally adjacent) the reverse staircase structure and may longitudinally extend completely through the tiers 108, but may continuously laterally extend from a bottom (e.g., as defined by one or more of the tier 108k and the tier 108j and) of the reverse staircase structure to a top (e.g., a laterally inward end of the tier 108a) of the reverse staircase structure.

Any desired number (e.g., quantity, amount) of openings 120 may be formed in the modified stack structure 112. The number of openings 120 may correspond to desired configurations (e.g., shapes, sizes, positions) of conductive structures to be formed in the modified stack structure 112 through subsequent processing acts, as described in further detail below. A single (e.g., only one) opening 120 may be formed laterally inward (e.g., in the Y-direction) of the staircase structures 114 and may continuously laterally extend across and between (e.g., in the X-direction) the staircase structures 114, or multiple (e.g., more than one) openings 120 may be formed laterally inward (e.g., in the Y-direction) of the staircase structures 114 and may continuously laterally extend in parallel across and between (e.g., in the X-direction) the staircase structures 114. As shown in FIG. 1D, in some embodiments, two (2) openings 120 (e.g., the first opening 120a, and the second opening 120b) are formed in the modified stack structure 112. The two (2) openings 120 may be disposed between the stadium structures 118 (e.g., the first stadium structure 118a, and the second stadium structure 118b) of the modified stack structure 112, and may flank opposing sides of the remaining middle section 122 of the modified stack structure 112. In additional embodiments, more than two (2) openings 120 are formed in the modified stack structure 112. For example, at least one additional opening (e.g., a third opening) may be formed in the remaining middle section 122 of the modified stack structure 112 (e.g., laterally between the first opening 120*a* and the second opening 120*b*). The at least one additional opening may extend completely longitudinally through the remaining middle section 122 of the modified stack structure 112, and may continuously laterally extend across the remaining middle section 122 in parallel to the other openings 120 (e.g., the first opening 120*a*, and the second opening 120*b*).

The dimensions and spacing of the one or more openings 120 may be selected to provide desired dimensions (e.g., widths) to and/or maintain desired dimensions of the staircase structures 114 (including the steps 116 thereof), and to provide desired dimensions (e.g., widths), continuity, and spacing to conductive structures to be formed using the openings 120, as described in further detail below. If more than one opening 120 is formed in the modified stack structure 112, each of the openings 120 may exhibit substantially the same dimensions (e.g., substantially the same width, substantially the same length, and substantially the same height), or at least one of the openings 120 may exhibit one or more different dimensions (e.g., a different width, a different length, and/or a different height) than at least one other of the openings 120. In some embodiments, each of the openings 120 exhibits substantially the same dimensions. In addition, if more than two (2) openings 120 are formed in the modified stack structure 112, adjacent openings 120 may be substantially uniformly (e.g., evenly) spaced apart from one another, or may be non-uniformly (non-evenly) spaced apart from one another. In some embodiments, adjacent openings 120 are substantially uniformly spaced apart from one another. The openings 120 may be symmetrically distributed across the modified stack structure 112, or may be asymmetrically distributed across the modified stack structure 112.

The openings 120 may be formed in the modified stack structure 112 using at least one conventional material removal processes, which is not described in detail herein. For example, one or more portions of the modified stack structure 112 may be subjected to at least one etching process (e.g., at least one dry etching process, such as at least one of a reactive ion etching (RIE) process, a deep RIE process, a plasma etching process, a reactive ion beam etching process, and a chemically assisted ion beam etching process; at least one wet etching process, such as at least one of a hydrofluoric acid etching process, a buffered hydrofluoric acid etching process, and a buffered oxide etching process) to form the openings 120 in the modified stack structure 112. The material removal process may remove one or more portions of the staircase structures 114 (e.g., so as to reduce widths of the staircase structures 114), and/or may remove one or more portions of the modified stack structure 112 previously covered by the masking structure 110 (FIG. 1C).

Figure 1E:
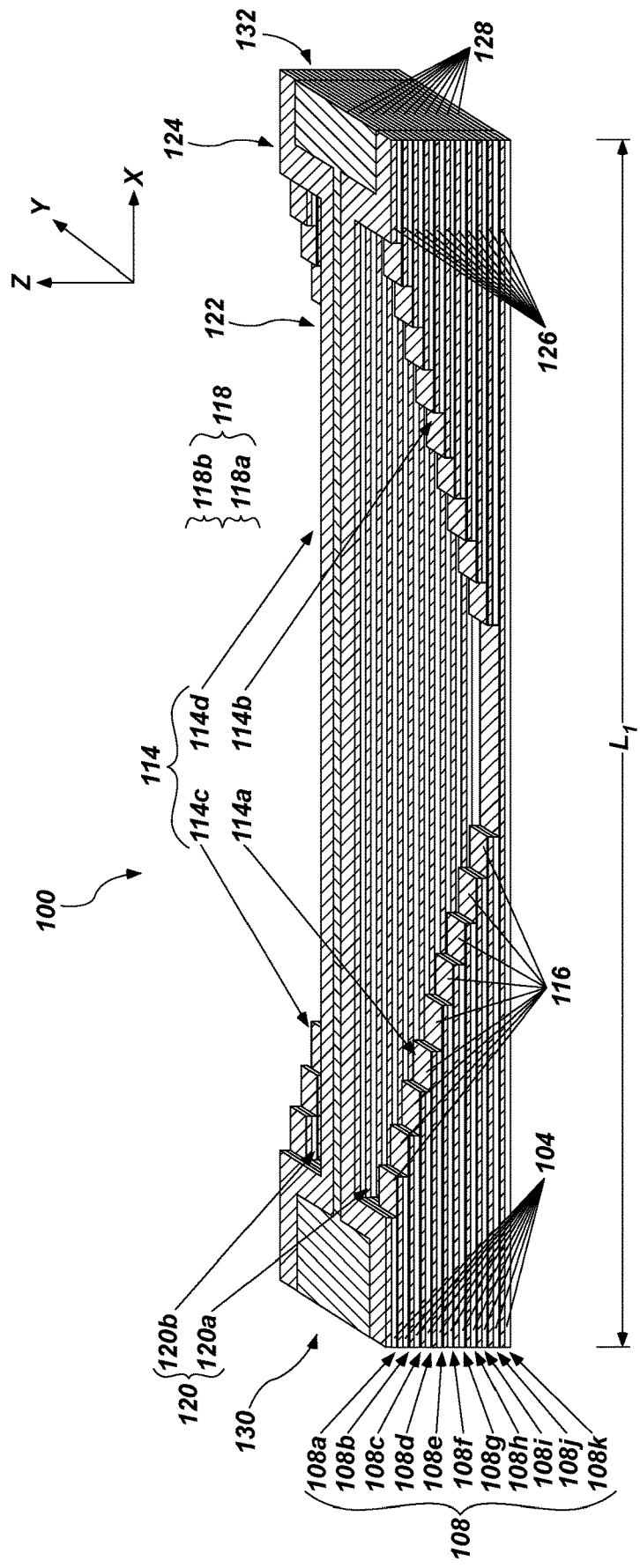

Referring next to FIG. 1E, portions of the additional insulating structures 106 (FIG. 1D) may be selectively removed, and may be replaced with a conductive material to form a conductive stack structure 124. As shown in FIG. 1E, each of the tiers 108 of the conductive stack structure 124 may include one or more conductive structures 126 (e.g., conductive gates, conductive plates) extending (e.g., in the X-direction and/or in the Y-direction) into lateral surfaces thereof. The one or more conductive structures 126 of each tier 108 of the conductive stack structure 126 may at least partially (e.g., substantially) laterally surround remaining portions 128 (e.g., unremoved portions) of the additional insulating structures 106.

The conductive structures 126 may follow (e.g., route along) lateral (e.g., side) surfaces of the conductive stack structure 124. For example, the conductive structures 126 may extend into and along outer lateral surfaces (e.g., peripheral lateral surfaces) of the tiers 108, as well as into and along inner lateral surfaces of the tiers 108 (e.g., lateral surfaces at least partially defined by the openings 120 longitudinally extending through the tiers 108). For each of the tiers 108, the conductive structures 126 may laterally extend to and around each of the openings 120 (e.g., completely around ends of the openings 120, and completely across the portions of the middle section 122 of the conductive stack structure 124 adjacent the openings 120) to form one or more continuous conductive paths between a first end 130 of the conductive stack structure 124 and a second, opposing end 132 of the conductive stack structure 124. The first end 130 and the second, opposing end 132 of the conductive stack structure 124 may each be coupled to other components of a semiconductor device (e.g., a memory device) including the semiconductor device structure 100, such as one or more memory cell arrays (e.g., vertical memory cell arrays). In addition, portions of at least some of the conductive structures 126 may laterally extend (e.g., in the X-direction) to and at least partially define the staircase structures 114 of the conductive stack structure 124 to form conductive contact regions (e.g., landing pad regions) for at least some of the tiers 108. For each of the conductive structures 126, portions thereof laterally extending to and at least partially defining one or more of the staircase structures 114 may be integral and continuous with other portions thereof laterally extending to and around the openings 120 positioned laterally inward of (e.g., laterally inwardly adjacent) the staircase structures 114. Furthermore, in tiers 108 longitudinally below the staircase structures 114 (e.g., untrimmed tiers 108 and/or unchopped tiers 108), the conductive structures 126 thereof may laterally extend to and may completely surround the openings 120.

In some embodiments, the conductive stack structure 124 includes multiple (e.g., more than one) conductive structures 126 in one or more (e.g., each) of the tiers 108 thereof. By way of non-limiting example, as shown in FIG. 1E, each of the one or more tiers 108 may include one conductive structure 126 at least partially defining the first stadium structure 118*a* and surrounding sides of the first opening 120*a*, and may also include an additional conductive structure 126 at least partially defining the second stadium structure 118*b* and surrounding sides of the second opening 120*b*. The conductive structures 126 associated with the first stadium structure 118*a* and the first opening 120*a* may each extend laterally inward from the first end 130 and the second, opposing end 132 of the conductive stack structure 124 along outer lateral surfaces of the conductive stack structure 124 to the first stadium structure 118*a*, wherein portions of each of the conductive structures 126 may at least partially define the first stadium structure 118*a* (e.g., including the first forward staircase structure 114*a* and the first reverse staircase structure 114*b*) and other portions of each of the conductive structures 126 may extend around inner lateral surfaces of the conductive stack structure 124 at least partially defined by the first opening 120*a*. The additional conductive structures 126 associated with the second stadium structure 118*b* and the second opening 120*b* may each extend laterally inward from the first end 130 and the second, opposing end 132 of the conductive stack structure 124 along other outer lateral surfaces of the conductive stack structure 124 to the second stadium structure 118*b*, wherein portions of each of the additional conductive structures 126 may at least partially define the second stadium structure 118*b* (e.g., including the second forward staircase structure 114c and the second reverse staircase structure 114d) and other portions of each of the additional conductive structures 126 may extend around inner lateral surfaces of the conductive stack structure 124 at least partially defined by the second opening 120b. For each of the tiers 108, the multiple conductive structures 126 may be separated (e.g., isolated) from one another by the remaining portion 128 of the additional insulating structure 106 (FIG. 1D). For example, as shown in FIG. 1E, for each of the different tiers 108 (e.g., each of the tiers 108a through 108k) of the conductive stack structure 124, a conductive structure 126 associated with the first stadium structure 118a and the first opening 120a may be separated from an additional conductive structure 126 associated with the second stadium structure 118b and the second opening 120b by the remaining portion 128 of the additional insulating structure 106.

In additional embodiments, the conductive stack structure 124 includes a single (e.g., only one) conductive structure 126 in one or more (e.g., each) of the tiers 108 thereof. The single conductive structure 126 of each of the one or more tiers 108 may at least partially define each of the staircase structures 114, and may surround sides of each of the openings 120. For each of the one or more tiers 108, all portions of the single conductive structure 126 thereof may be integral and continuous with one another, and may form a continuous conductive path extending from the first end 130 of the conductive stack structure 124 to the second, opposing end 132 of the of the conductive stack structure 124. By way of non-limiting example, in embodiments wherein the conductive stack structure 124 includes at least one additional opening laterally between the first opening 120a and the second opening 120b, each of the tiers 108 may include a single conductive structure 126 at least partially defining each of the first stadium structure 118a and the second stadium structure 118b and surrounding sides of each of the first opening 120a, the second opening 120b, and the at least one additional opening. The single conductive structure 126 may extend laterally inward from the first end 130 and the second, opposing end 132 of the conductive stack structure 124 along outer lateral surfaces of the conductive stack structure 124 to each of the first stadium structure 118a and the second stadium structure 118b, wherein portions of the single conductive structure 126 may extend into and at least partially define the first stadium structure 118a (e.g., including the first forward staircase structure 114a and the first reverse staircase structure 114b) and second stadium structure 118b (e.g., including the second forward staircase structure 114c and the second reverse staircase structure 114d) and other portions of the single conductive structure 126 may extend around inner lateral surfaces of the tier 108 at least partially defined by one or more of the first opening 120a, the second opening 120b, and the additional opening. In such embodiments, the remaining portions 128 of the additional insulating structure 106 (FIG. 1D) laterally intervening between the first opening 120a and the second opening 120b may be absent (e.g., omitted) from the conductive stack structure 124.

The dimensions and shapes of the conductive structures 126 may directly correspond to the dimensions and shapes of the removed portions of the additional insulating structures 106 (FIG. 1D). A width (e.g., lateral depth within the conductive stack structure 124) of each of the conductive structures 126 may be substantially uniform across the entire path (e.g., route) of the conductive structure 126, or the width of at least one of the conductive structures 126 may be substantially non-uniform (e.g., variable) across different portions of the path of the conductive structure 126. In addition, each of the conductive structures 126 may exhibit a different shape and at least one different dimension than each other of the conductive structures 126, or at least one of the conductive structures 126 may exhibit one or more of substantially the same shape and substantially the same dimensions as at least one other of the conductive structures 126. By way of non-limiting example, as shown in FIG. 1E, conductive structures 126 of different tiers 108 may exhibit different shapes and different dimensions (e.g., different lengths associated with the locations of the different steps 116 of the staircase structures 114) than one another, but conductive structures 126 within the same tier 108 may exhibit substantially the same shapes and substantially the same dimensions as one another (e.g., conductive structures 126 within the same tier 108 may be mirror images of one another). In additional embodiments, conductive structures 126 of two or more different tiers 108 may exhibit substantially the same shapes and substantially the same dimensions as one another. In further embodiments, conductive structures 126 within the same tier 108 may exhibit one or more of a different shape and at least one different dimension than one another.

The conductive structures 126 may be formed of and include at least one conductive material, such as a metal, a metal alloy, a conductive metal oxide, a conductive metal nitride, a conductive metal silicide, a conductively-doped semiconductor material, or combinations thereof. By way of non-limiting example, the conductive structures 126 may be formed of and include at least one of tungsten (W), tungsten nitride (WN), nickel (Ni), tantalum (Ta), tantalum nitride (TaN), tantalum silicide (TaSi), platinum (Pt), copper (Cu), silver (Ag), gold (Au), aluminum (Al), molybdenum (Mo), titanium (Ti), titanium nitride (TiN), titanium silicide (TiSi), titanium silicon nitride (TiSiN), titanium aluminum nitride (TiAlN), molybdenum nitride (MoN), iridium (Ir), iridium oxide ($IrO_x$), ruthenium (Ru), ruthenium oxide ($RuO_x$), and conductively-doped silicon. In some embodiments, the conductive structures 126 are formed of and include W.

The conductive structures 126 may be formed by selectively removing portions of the additional insulating structures 106 (FIG. 1D) relative to the insulating structures 104 to form recessed regions laterally extending into each of the tiers 108, and then at least partially (e.g., substantially) filling the recessed regions with at least one conductive material. The recessed regions may be formed by subjecting the modified stack structure 112 (FIG. 1D) to at least one etching processing (e.g., an isotropic etching process) employing an etch chemistry in which the insulative material of the additional insulating structures 106 (FIG. 1D) is selectively removed relative to that of the insulating structures 104. By way of non-limiting example, if the insulating structures 104 are formed of and include silicon dioxide ($SiO_2$), and the additional insulating structures 106 are formed of and include silicon nitride ($Si_3N_4$), the modified stack structure 112 may be exposed to an etchant comprising phosphoric acid ($H_3O_4P$) to selectively remove portions of the additional insulating structures 106 adjacent exposed lateral surfaces (e.g., exposed outer lateral surfaces, exposed inner lateral surfaces at least partially defined by the openings 120) of the modified stack structure 112. Thereafter, the conductive material may be formed (e.g., delivered, deposited) within recessed regions to form the conductive structures 126.

In additional embodiments, rather than selectively removing and replacing portions of the additional insulating structures 106 (FIG. 1D) to form the conductive stack structure 124, portions of the insulating structures 104 may instead be selectively removed and replaced with conductive material to form a conductive stack structure. Aside from the sequence (e.g., order) of the alternating conductive structures and insulating structures of such a conductive stack structure and differences (if any) associated with material properties of the insulating structures 104 as compared to those of the additional insulating structures 106, such a conductive stack structure may be substantially similar to and may have little or no difference in terms of functionality and/or operability as compared to the conductive stack structure 124 depicted in FIG. 1E.

Figure 1F:
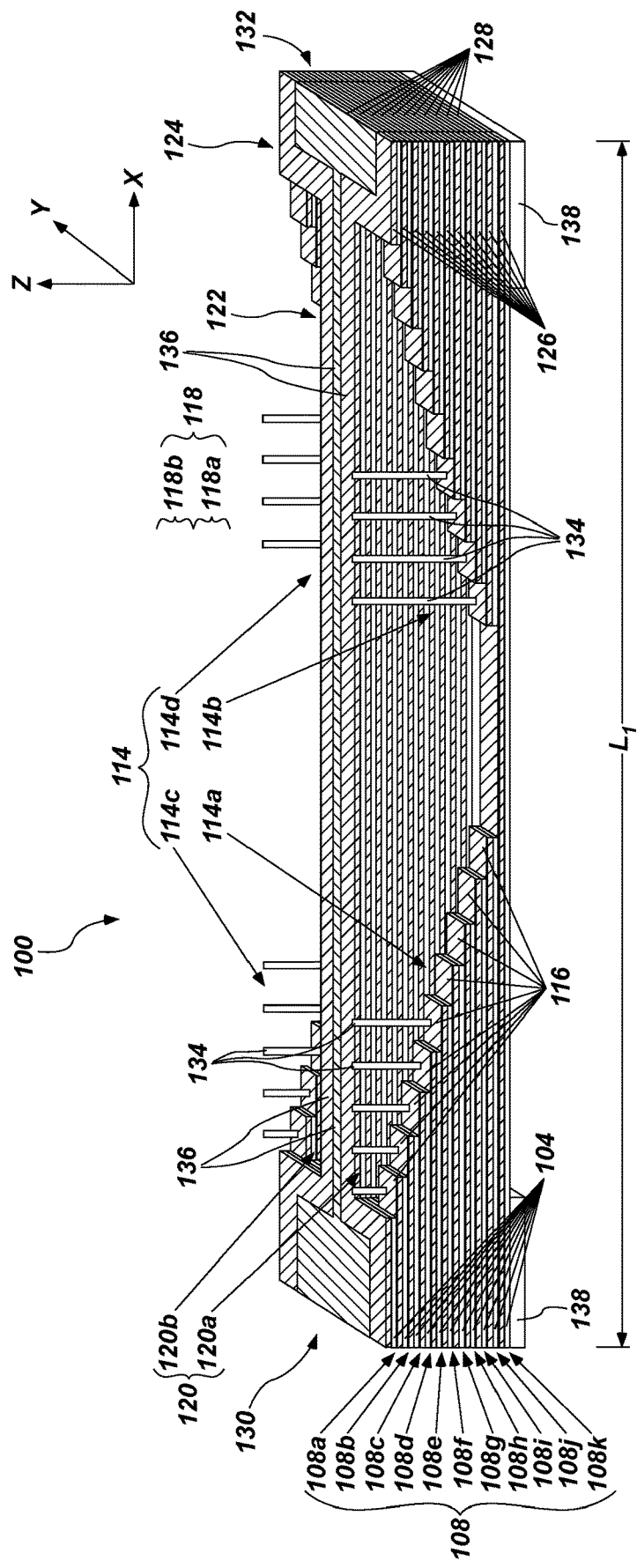
Figure 1G:
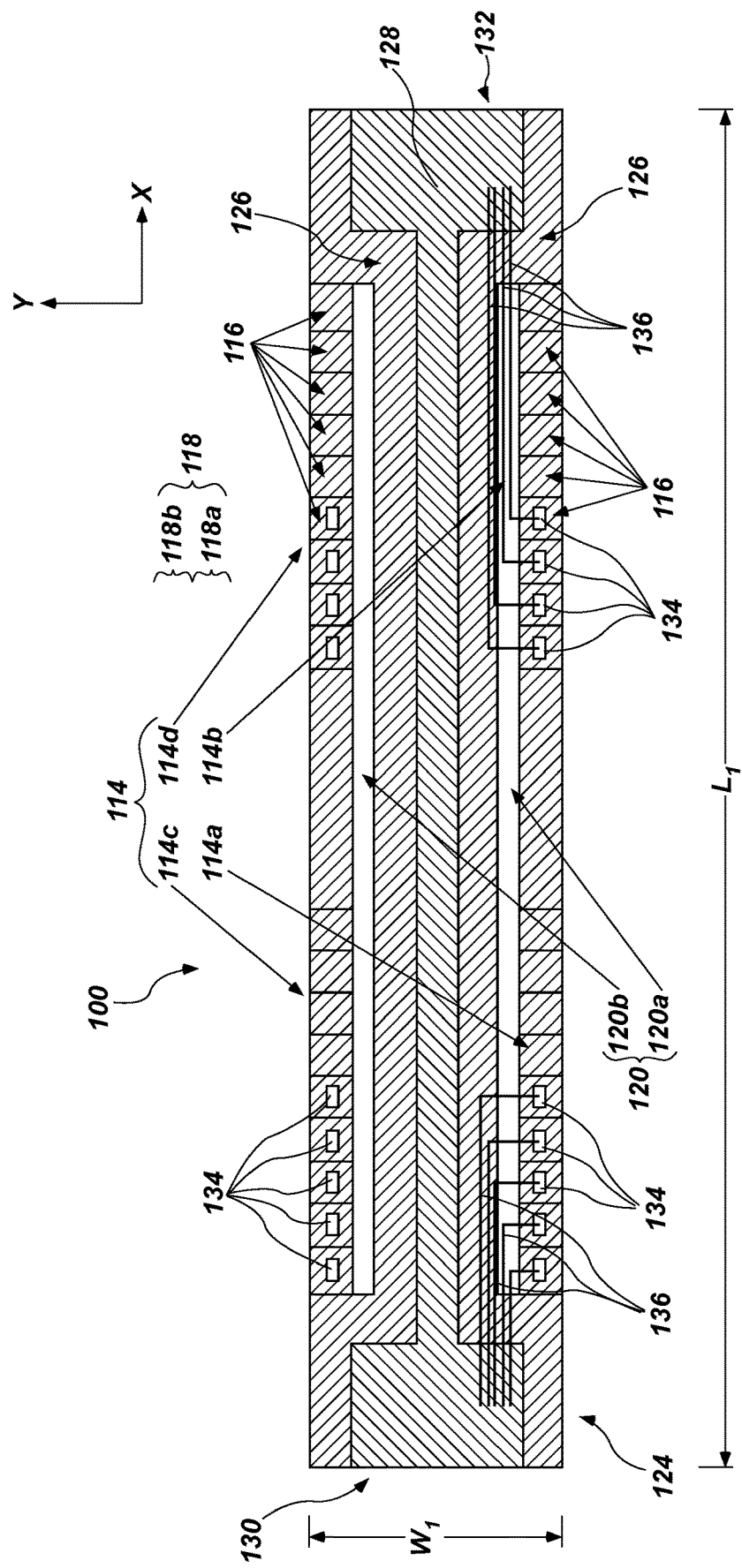

Referring next to FIG. 1F, conductive contact structures 134 (e.g., conductive plugs, conductive vertical interconnects) may be formed on, over, and/or within the one or more of staircase structures 114 of the conductive stack structure 124, and conductive routing structures 136 (e.g., conductive interconnects, conductive bridges) may be formed to electrically connect the conductive contact structures 134 to at least one string driver device 138. FIG. 1G is a top-down view of the semiconductor device structure 100 at the processing stage depicted in FIG. 1F.

The conductive contact structures 134 may be coupled to the conductive structures 126 of the tiers 108 of the conductive stack structure 124 at the steps 116 of the staircase structures 114. Each of the tiers 108 (e.g., each of the tiers 108a through 108k) may have one or more of the conductive contact structures 134 coupled to the conductive structure(s) 126 thereof, or less than all of the tiers 108 (e.g., less than all of the tiers 108a through 108k, such as only tiers 108b through 108j) may have one or more of the conductive contact structures 134 coupled to the conductive structure(s) 126 thereof. Each of the tiers 108 including one or more of the conductive contact structures 134 coupled to the conductive structure(s) 126 thereof may include a single (e.g., only one) conductive contact structure 134 coupled to the conductive structure(s) 126 thereof, or may include multiple (e.g., more than one) conductive contact structures 134 coupled thereto. As a non-limiting example, as shown in FIG. 1F, in embodiments wherein each of the tiers 108 includes multiple conductive structures 126 (e.g., multiple conductive structures 126 laterally isolated from one another by the remaining portion 128 of one of the additional insulating structures 106 (FIG. 1D)), each conductive structure 126 of a given tier 108 may have at least one of the conductive contact structures 134 coupled thereto at one or more of the steps 116 (e.g., one or more of the steps 116 of the first stadium structure 118a, one or more of the steps 116 of the second stadium structure 118b) at least partially defined by the conductive structure 126. As another non-limiting example, in embodiments wherein each of the tiers 108 includes a single (e.g., only one) conductive structure 126, the single conductive structure 126 may have at least one of the conductive contact structures 134 coupled thereto at one or more of the steps 116 at least partially defined by the single conductive structure 126.

The conductive contact structures 134 may be formed on or over a single (e.g., only one) staircase structure 114 of the conductive stack structure 124, or may be formed on or over multiple (e.g., more than one) staircase structures 114 of the conductive stack structure 124. By way of non-limiting example, as shown in FIGS. 1F and 1G, within at least one of the stadium structures 118 (e.g., at least one of the first stadium structure 118a and the second stadium structure 118b) of the conductive stack structure 124, a portion of the conductive contact structures 134 may be formed on or over a forward staircase structure (e.g., the first forward staircase structure 114a, the second forward staircase structure 114c) and an additional portion of the conductive contact structures 134 may be formed on or over a reverse staircase structure (e.g., the first reverse staircase structure 114b, the second reverse staircase structure 114d). In additional embodiments, within at least one of the stadium structures 118, each of the conductive contact structures 134 may be formed on or over a forward staircase structure (e.g., the first forward staircase structure 114a, the second forward staircase structure 114c). In further embodiments, within at least one of the stadium structures 118, each of the conductive contact structures 134 may be formed on or over a reverse staircase structure (e.g., the first reverse staircase structure 114b, the second reverse staircase structure 114d).

Conductive contact structures 134 formed on or over the same staircase structure 114 (e.g., one of the first forward staircase structure 114a, the first reverse staircase structure 114b, the second forward staircase structure 114c, and the second reverse staircase structure 114d) may be substantially uniformly (e.g., evenly) spaced apart from one another, or may be non-uniformly (e.g., unevenly) spaced apart from one another. Conductive contact structures 134 formed on or over the same staircase structure 114 may be formed to be generally centrally positioned (e.g., in at least the X-direction) on or over the steps 116 associated therewith. Accordingly, distances between adjacent conductive contact structures 134 located on or over the same staircase structure 114 may vary in accordance with variance in the lengths (e.g., in the X-direction) of the adjacent steps 116 associated with the adjacent conductive contact structures 134. In addition, conductive contact structures 134 formed on or over the same staircase structure 114 may be substantially aligned with one another (e.g., not offset from one another in the Y-direction), or may be at least partially non-aligned with one another (e.g., offset from one another in the Y-direction).

The conductive contact structures 134 may be formed of and include at least one conductive material, such as a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or combinations thereof. Each of the conductive contact structures 134 may have substantially the same material composition, or at least one of the conductive contact structures 134 may have a different material composition than at least one other of the conductive contact structures 134.

With continued reference to FIG. 1F, the conductive routing structures 136 may be coupled (e.g., attached, connected) to the conductive contact structures 134 and at least one string driver device 138. The string driver device 138 may be formed of and include a plurality of switching devices (e.g., transistors). Suitable designs and configurations for the at least one string driver device 138 are well known in the art, and are therefore not described in detail herein. The string driver device 138 may, for example, underlie one or more portions (e.g., central portions, peripheral portions, combinations thereof) of the conductive stack structure 124. The combination of the conductive contact structures 134 and the conductive routing structures 136 may electrically connect the conductive structures 126 of one or more of the tiers 108 to the string driver device 138, facilitating application of voltages to the conductive structures 126 using the string driver device 138. The continuous conductive paths across the conductive stack structure 124 (e.g., from the first end 130 to the second, opposing end 132) provided by the configurations of the conductive structures 126 may permit an individual (e.g., single) switching device (e.g., transistor) of the string driver device 138 to drive voltages completely across (e.g., from the first end 130 to the second, opposing end 132) and/or in opposing directions across (e.g., toward the first end 130 and toward the second, opposing end 132) an individual tier 108 electrically connected thereto.

The conductive routing structures 136 may extend from the conductive contact structures 134, over one or more sections of the conductive stack structure 124, through one or more additional sections of the conductive stack structure 124, and to one or more of the string driver devices 138. By way of non-limiting example, as shown in FIG. 1F, the conductive routing structures 136 may extend from conductive contact structures 134, laterally over the middle section 122 of the conductive stack structure 124, longitudinally through insulating sections of the tiers 108 including the remaining portions 128 of the additional insulating structures 106 (FIG. 1D) and portions of the insulating structures 104, and to one or more of the string driver devices 138. In addition, each of the conductive routing structures 136 may extend to the same string driver device 138, or at least one of the conductive routing structures 136 may extend to a different string driver device 138 than at least one other of the conductive routing structures 136.

The conductive routing structures 136 may be formed of and include at least one conductive material, such as a metal (e.g., W, Ti, Mo, Nb, V, Hf, Ta, Cr, Zr, Fe, Ru, Os, Co, Rh, Ir, Ni, Pd, Pt, Cu, Ag, Au, Al), a metal alloy (e.g., a Co-based alloy, an Fe-based alloy, a Ni-based alloy, an Fe- and Ni-based alloy, a Co- and Ni-based alloy, an Fe- and Cu-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or combinations thereof. Each of the conductive routing structures 136 may have substantially the same material composition, or at least one of the conductive routing structures 136 may have a different material composition than at least one other of the conductive routing structures 136.

The conductive contact structures 134, the conductive routing structures 136, and the string driver devices 138 may each independently be formed using conventional processes (e.g., conventional deposition processes, conventional photolithography processes, conventional material removal processes) and conventional processing equipment, which are not described in detail herein.

Thus, in accordance with embodiments of the disclosure, a method of forming a semiconductor device structure comprises forming a stack structure comprising stacked tiers each comprising an insulating structure and an additional insulating structure longitudinally adjacent the insulating structure. A masking structure is formed over a portion of the stack structure. Portions of the stacked tiers of the stack structure not covered by the masking structure are removed to form at least one staircase structure having steps comprising lateral ends of the stacked tiers. The masking structure is removed after forming the at least one staircase structure. At least one opening is formed laterally inward of the at least one staircase structure, the at least one opening extending through the stacked tiers and continuously across an entire length of the at least one staircase structure. Portions of the additional insulating structure of each of the stacked tiers are replaced with at least one conductive material to form at least one conductive structure in each of the stacked tiers, the at least one conductive structure extending continuously from at least one of the steps of the at least one staircase structure and around the at least one opening to form at least one continuous conductive path extending completely across each of the stacked tiers.

In addition, in accordance with additional embodiments of the disclosure, a semiconductor device structure comprises stacked tiers each comprising at least one conductive structure and at least one insulating structure longitudinally adjacent the at least one conductive structure, at least one staircase structure having steps comprising lateral ends of the stacked tiers, and at least one opening extending through the stacked tiers and continuously across an entire length of the at least one staircase structure. The at least one conductive structure of each of the stacked tiers extends continuously from at least one of the steps of the at least one staircase structure and around the at least one opening to form at least one continuous conductive path extending completely across each of the stacked tiers.

Figure 2:
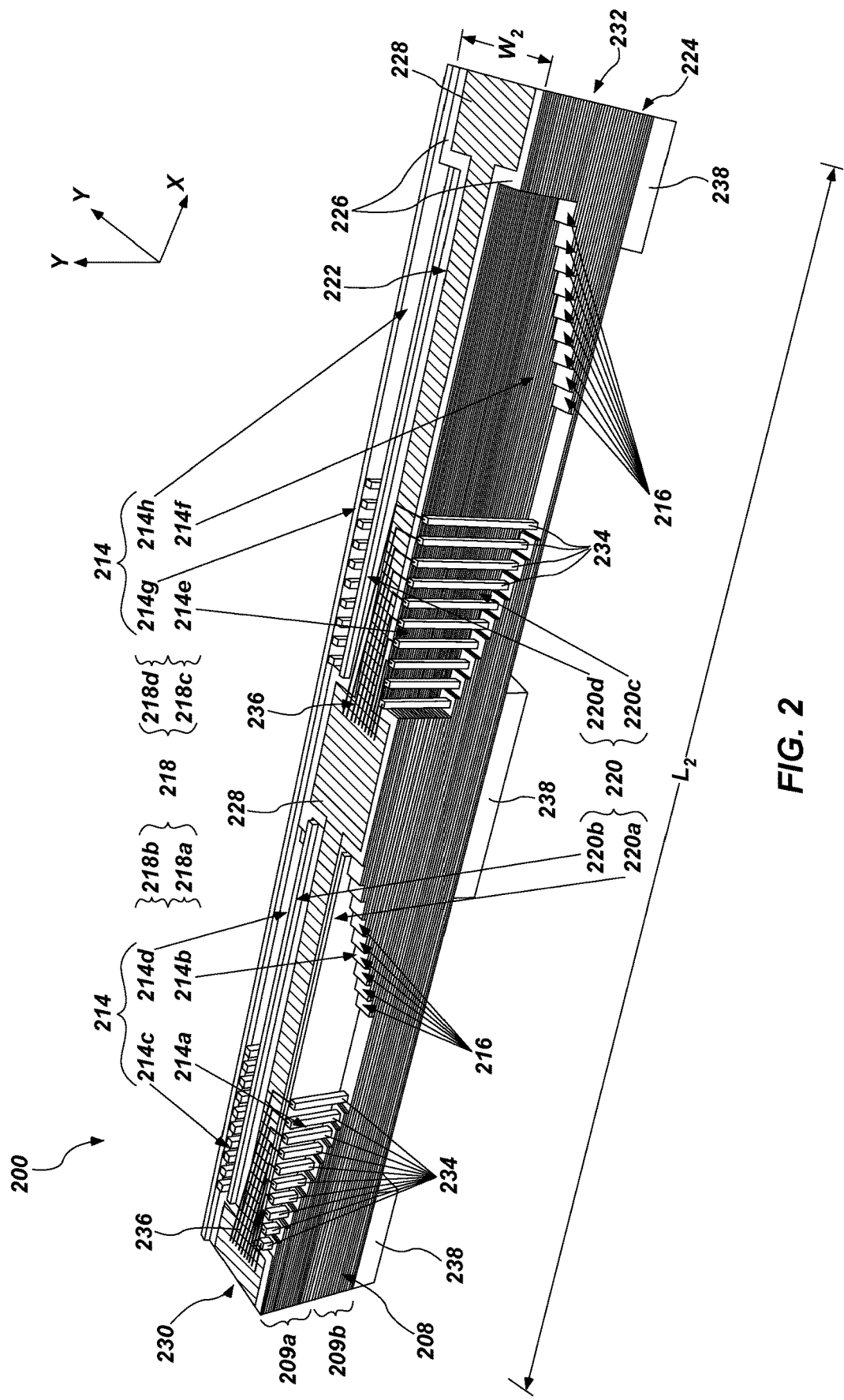
FIG. 2 is a perspective view of a semiconductor device structure, in accordance with additional embodiments of the disclosure.

One of ordinary skill in the art will appreciate that, in accordance with additional embodiments of the disclosure, the features and feature configurations described above in relation to FIGS. 1A-1G may be readily adapted to the design needs of different semiconductor devices (e.g., different memory devices, such as different 3D NAND Flash memory devices). By way of non-limiting example, FIG. 2 illustrates a semiconductor device structure 200 in accordance with another embodiment of the disclosure. The semiconductor device structure 200 may have similar features and functionalities to the semiconductor device structure 100 previously described. However, the semiconductor device structure 200 may, for example, include a relatively greater number of tiers 208, as well one or more additional features (e.g., additional openings, additional staircase structures, additional conductive contact structures, additional conductive routing structures) and/or feature configurations (e.g., sizes, shapes, arrangements) to account for the relatively greater number of tiers 208. To avoid repetition, not all features shown in FIG. 2 are described in detail herein. Rather, unless described otherwise below, features designated by a reference numeral that is a 100 increment of the reference numeral of a feature described previously in relation to one or more of FIGS. 1A-1G will be understood to be substantially similar to the feature described previously.

As shown in FIG. 2, the semiconductor device structure 200 may include a conductive stack structure 224 exhibiting alternating insulating structures and conductive structures 226 arranged in tiers 208. For clarity, the insulating structures of each of the tiers 208 are not depicted FIG. 2. However, aside from variances in shape and size, the insulating structures of the conductive stack structure 224 may be substantially similar to, and may be formed and arranged in substantially the same manner as, the insulating structures 104 previously described in relation to the conductive stack structure 124. The conductive stack structure 224 may include a greater number of tiers 208 than the number of the tiers 108 included in the conductive stack structure 124 of the semiconductor device structure 100 previously described in relation to FIGS. 1F and 1G. For example, as shown in FIG. 2, the conductive stack structure 224 may include twenty-one (21) tiers 208. In additional embodiments, the conductive stack structure 224 may include a different number of the tiers 208, such as greater than twenty-one (21) tiers 208 or less than twenty-one (21) tiers 208.

The conductive stack structure 224 may include staircase structures 214, and openings 220 positioned laterally inward (e.g., in the Y-direction) of the staircase structures 214. In FIG. 2, for clarity in identifying the positions and dimensions of the openings 220, each of the openings 220 is depicted as being filled with a structure. However, the openings 220 may be substantially free of such structures (e.g., the structures may be absent from the openings 220). Alternatively, one or more of the openings 220 may comprise filled openings including the depicted structures therein. The structures may, for example, comprise insulating structures formed of and including at least one insulating material (e.g., an oxide material, such as silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or combinations thereof; a nitride material, such as silicon nitride; an oxynitride material, such as silicon oxynitride; amphorous carbon).

As shown in FIG. 2, the conductive stack structure 224 includes multiple (e.g., more than one) staircase structures 214. The conductive stack structure 224 may, for example, include multiple stadium structures 218 each including opposing staircase structures 214. The multiple stadium structures 218 may be positioned in series and in parallel with one another. By way of non-limiting example, as shown in FIG. 2, the conductive stack structure 224 may include a first stadium structure 218a, a second stadium structure 218b, a third stadium structure 218c, and a fourth stadium structure 218d. The first stadium structure 218a may include a first forward staircase structure 214a, and a first reverse staircase structure 214b that mirrors the first forward staircase structure 214a. The second stadium structure 218b may extend parallel (e.g., in the X-direction) to the first stadium structure 218a, and may include a second forward staircase structure 214c, and a second reverse staircase structure 214d that mirrors the second forward staircase structure 214c. The third stadium structure 218c may extend in series (e.g., in the X-direction) to the first stadium structure 218a, and may include a third forward staircase structure 214e, and a third reverse staircase structure 214f that mirrors the third forward staircase structure 214e. The fourth stadium structure 218d may extend in parallel (in the X-direction) with the third stadium structure 218c and in series (e.g., in the X-direction) to the second stadium structure 218b, and may include a fourth forward staircase structure 214g, and a fourth reverse staircase structure 214h that mirrors the fourth forward staircase structure 214g. The first stadium structure 218a and the second stadium structure 218b may be at least partially defined by ends of an upper group 209a of the tiers 208 (e.g., tiers 208 positioned relatively higher in the Z-direction), and may serve as redundant and/or alternative means of connecting to the tiers 208 of the upper group 209a. The third stadium structure 218c and the fourth stadium structure 218d may be at least partially defined by ends of a lower group 209b of the tiers 208 (e.g., tiers 208 positioned relatively lower in the Z-direction), and may serve as redundant and/or alternative means of connecting to the tiers 208 of the lower group 209b.

In additional embodiments, the conductive stack structure 224 may exhibit one or more of a different number and different configuration of the staircase structures 214. By way of non-limiting example, the conductive stack structure 224 may include only one (1) stadium structure 218 (e.g., only the first stadium structure 218a, or only the second stadium structure 218b) associated with (e.g., at least partially defined by ends of) the upper group 209a of the tiers 208, may include only one (1) stadium structure 218 (e.g., only the third stadium structure 218c, or only the fourth stadium structure 218d) associated with the lower group 209b of the tiers 208, may include more than two (2) stadium structures 218 in parallel with one another and associated with the upper group 209a of the tiers 208, may include more than two (2) stadium structures 218 in parallel with one another and associated with the lower group 209b of the tiers 208, may include additional stadium structures 218 in series with the first stadium structure 218a and the third stadium structure 218c, may include additional stadium structures 218 in series with the second stadium structure 218b and the fourth stadium structure 218d, may include one or more forward staircase structures (e.g., one or more of the first forward staircase structure 214a, the second forward staircase structure 214c, the third forward staircase structure 214e, and the fourth forward staircase structure 214g) but not one or more reverse staircase structures (e.g., one or more of the first reverse staircase structure 214b, the second reverse staircase structure 214d, the third reverse staircase structure 214f, and the fourth reverse staircase structure 214h may be omitted), and/or may include one or more reverse staircase structures (e.g., one or more of the first reverse staircase structure 214b, the second reverse staircase structure 214d, the third reverse staircase structure 214f, and the fourth reverse staircase structure 214h) but not one or more forward staircase structures (e.g., one or more of the first forward staircase structure 214a, the second forward staircase structure 214c, the third forward staircase structure 214e, and the fourth forward staircase structure 214g may be omitted).

As shown in FIG. 2, the openings 220 may longitudinally extend (e.g., in the Z-direction) through the conductive stack structure 224, may be positioned laterally inward (e.g., in the Y-direction) of the staircase structures 214, and may continuously laterally extend (e.g., in the X-direction) across entire lengths of the staircase structures 214. By way of non-limiting example, as shown in FIG. 2, the openings 220 may extend completely through each of the tiers 208, may be positioned laterally inwardly adjacent the stadium structures 218, and may continuously laterally extend across entire lengths of the stadium structures 218. A first opening 220a may be positioned laterally between (e.g., in the Y-direction) the first stadium structure 218a and a middle section 222 of the conductive stack structure 224, and may laterally extend (e.g., in the X-direction) from a top of the first forward staircase structure 214a to a top of the first reverse staircase structure 214b. A second opening 220b may be positioned laterally between (e.g., in the Y-direction) the second stadium structure 218b and the middle section 222 of the conductive stack structure 224, and may laterally extend parallel (e.g., in the X-direction) to the first opening 220a from a top of the second forward staircase structure 214c to a top of the second reverse staircase structure 214d. A third opening 220c may be positioned laterally between (e.g., in the Y-direction) the third stadium structure 218c and the middle section 222 of the conductive stack structure 224, and may laterally extend (e.g., in the X-direction) from a top of the third forward staircase structure 214e to a top of the third reverse staircase structure 214f. A fourth opening 220d may be positioned laterally between (e.g., in the Y-direction) the fourth stadium structure 218d and the middle section 222 of the conductive stack structure 224, and may laterally extend parallel (e.g., in the X-direction) to the third opening 220c from a top of the fourth forward staircase structure 214g to a top of the fourth reverse staircase structure 214h.

In additional embodiments, the conductive stack structure 224 may include a different number of the openings 220. By way of non-limiting example, at least one additional opening may be formed in the middle section 222 of the conductive stack structure 224. The at least one additional opening may, for example, comprise a fifth opening positioned laterally between the first opening 220a and the second opening 220b and having substantially the same length as the first opening 220a and the second opening 220b, and/or may comprise a sixth opening positioned laterally between the third opening 220c and the fourth opening 220d and having substantially the same length as the third opening 220c and the fourth opening 220d. The at least one additional opening may extend completely longitudinally through the middle section 222 of the conductive stack structure 224, and may continuously laterally extend across the middle section 222 in parallel to the other openings 220.

As shown in FIG. 2, the conductive structures 226 may follow (e.g., route along) lateral (e.g., side) surfaces of the conductive stack structure 224. For example, the conductive structures 226 may extend into and along outer lateral surfaces (e.g., peripheral lateral surfaces) of the tiers 208, as well as into and along inner lateral surfaces of the tiers 208 (e.g., lateral surfaces at least partially defined by the openings 220 longitudinally extending through the tiers 208). For each of the tiers 208, the conductive structures 226 may laterally extend to and around each of the openings 220 (e.g., completely around ends of the openings 220, and completely across the portions of the middle section 222 of the conductive stack structure 224 adjacent the openings 220) to form one or more continuous conductive paths between a first end 230 of the conductive stack structure 224 and a second, opposing end 232 of the conductive stack structure 224. The first end 230 and the second, opposing end 232 of the conductive stack structure 224 may each be coupled to other components of a semiconductor device (e.g., a memory device) including the semiconductor device structure 200, such as one or more memory cell arrays (e.g., vertical memory cell arrays). In addition, portions of at least some of the conductive structures 226 may laterally extend (e.g., in the X-direction) to and at least partially define the staircase structures 214 of the conductive stack structure 224 to form conductive contact regions (e.g., landing pad regions) for at least some of the tiers 208. For example, portions of at least some of the conductive structures 226 of the upper group 209a of the tiers 208 may extend to at least partially define the first stadium structure 218a and the second stadium structure 218b, and portions of at least some of the conductive structures 226 of the lower group 209b of the tiers 208 may extend to at least partially define the third stadium structure 218c and the fourth stadium structure 218d. For each of the conductive structures 226, portions thereof laterally extending to and at least partially defining one or more of the staircase structures 214 may be integral and continuous with other portions thereof laterally extending to and around the openings 220 positioned laterally inward of (e.g., laterally adjacent) the staircase structures 214. Each of the tiers 208 may include multiple (e.g., more than one) conductive structures 226, or may include a single (e.g., only one) conductive structure 226.

With continued reference to FIG. 2, conductive contact structures 234 (e.g., conductive plugs, conductive vertical interconnects) may be coupled (e.g., attached, connected) to the conductive structures 226 of the tiers 208 at one or more of the staircase structures 214, and conductive routing structures 236 (e.g., conductive interconnects, conductive bridges) may be coupled to the conductive contact structures 234 and to one or more string driver devices 238. The string driver devices 238 may be formed of and include a plurality of switching devices (e.g., transistors). Suitable designs and configurations for the string driver devices 238 are well known in the art, and are therefore not described in detail herein. The string driver devices 238 may, for example, underlie one or more portions (e.g., central portions, peripheral portions, combinations thereof) of the conductive stack structure 224.

The conductive contact structures 234 and the conductive routing structures 236 may electrically connect the conductive structures 226 of the tiers 208 to the string driver devices 238. By way of non-limiting example, as shown in FIG. 2, a portion of the conductive contact structures 234 and the conductive routing structures 236 may electrically connect the upper group 209a of the tiers 208 to one or more of the string driver devices 238 at one or more of the staircase structures 214, and another portion of the conductive contact structures 234 and the conductive routing structures 236 may electrically connect the lower group 209b of the tiers 208 to one or more of the string driver devices 238 at one or more other of the staircase structures 214. A portion of the conductive contact structures 234 and the conductive routing structures 236 may be coupled to and extend between at least one of the string driver devices 238 and steps 216 of one or more of the first stadium structure 218a (e.g., steps 216 of the first forward staircase structure 214a, and/or steps 216 of the first reverse staircase structure 214b) and the second stadium structure 218b (e.g., steps 216 of the second forward staircase structure 214c and/or steps 216 of the second reverse staircase structure 214d) to electrically connect the conductive structures 226 of at least some of the upper group 209a of the tiers 208 to the string driver device 238. In addition, another portion of the conductive contact structures 234 and the conductive routing structures 236 may be coupled to and extend between at least one string driver device 238 and steps 216 of one or more of the third stadium structure 218c (e.g., steps 216 of the third forward staircase structure 214e, and/or steps 216 of the third reverse staircase structure 214f) and the fourth stadium structure 218d (e.g., steps 216 of the fourth forward staircase structure 214g, and/or steps 216 of the fourth reverse staircase structure 214h) to electrically connect the conductive structures 226 of at least some of the lower group 209b of the tiers 208 to the string driver device 238. The continuous conductive paths across the conductive stack structure 224 (e.g., from the first end 230 to the second, opposing end 232) provided by the configurations of the conductive structures 226 may permit an individual (e.g., single) switching device (e.g., transistor) of the string driver device 238 to drive voltages completely across (e.g., from the first end 230 to the second, opposing end 232) and/or in opposing directions across (e.g., toward the first end 230 and toward the second, opposing end 232) an individual tier 208 electrically connected thereto.

FIGS. 3A through 3F are simplified perspective (FIGS. 3A through 3E) and top-down (FIG. 3F) views illustrating embodiments of a method of forming another semiconductor device structure including a staircase structure, such as a memory array structure (e.g., a memory array block) for a 3D non-volatile memory device (e.g., a 3D NAND Flash memory device). With the description provided below, it will be readily apparent to one of ordinary skill in the art that the methods described herein may be used in various devices. In other words, the methods of the disclosure may be used whenever it is desired to form a semiconductor device including a staircase structure.

Figure 3A:
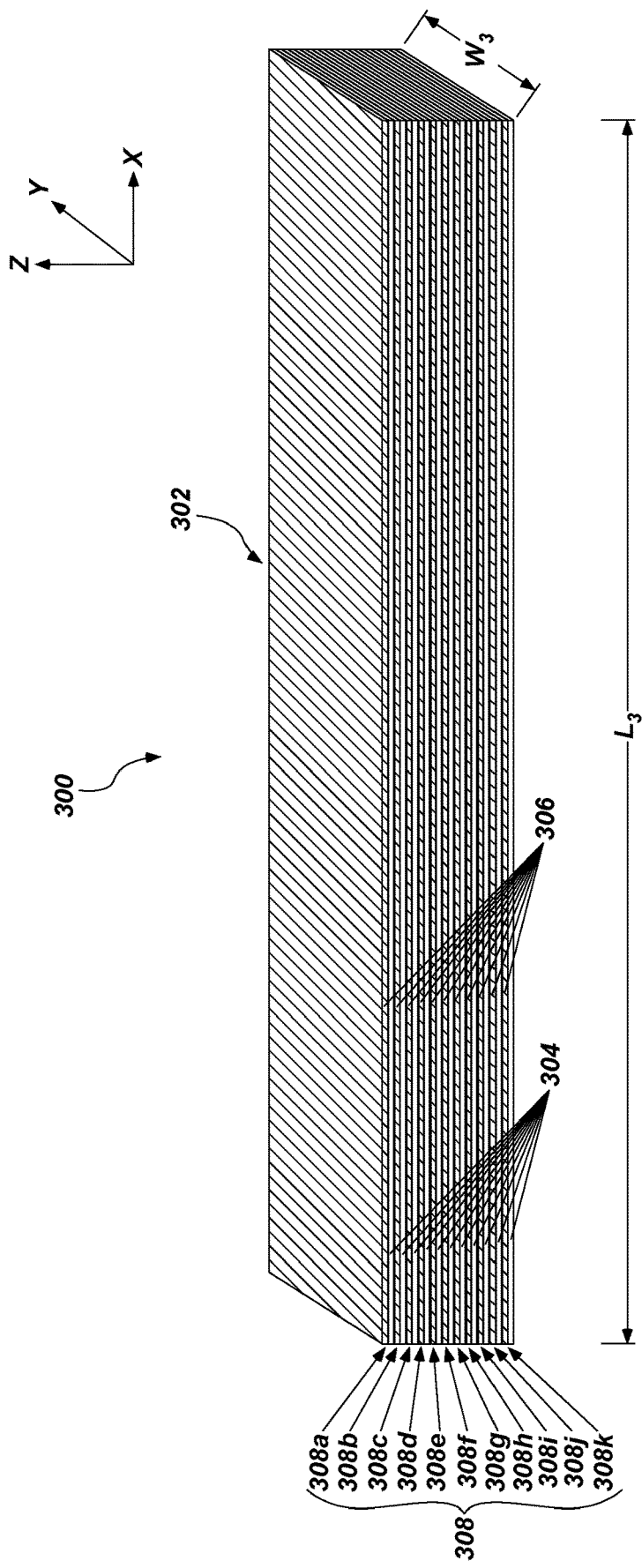
FIGS. 3A through 3F are perspective (FIGS. 3A through 3E) and top-down (FIG. 3F) views illustrating a method of forming a semiconductor device structure, in accordance with further embodiments of the disclosure.

Referring to FIG. 3A, a semiconductor device structure 300 may include a stack structure 302 exhibiting an alternating sequence of insulating structures 304 and additional insulating structures 306 arranged in tiers 308. Each of the tiers 308 may include one of the insulating structures 304 and one of the additional insulating structures 306. The stack structure 302, including the tiers 308 of the insulating structures 304 and the additional insulating structures 306, may be substantially similar to and may be formed in substantially the same manner as the stack structure 102 previously described herein with reference to FIG. 1A. As shown in FIG. 3A, in some embodiments, the alternating sequence of the insulating structures 304 and the additional insulating structures 306 begins with one of the insulating structures 304. In additional embodiments, the arrangement of the insulating structures 304 and the additional insulating structures 306 is switched relative to that depicted in FIG. 3A (e.g., the alternating sequence of the insulating structures 304 and the additional insulating structures 306 begins with one of the additional insulating structures 306).

Figure 3B:
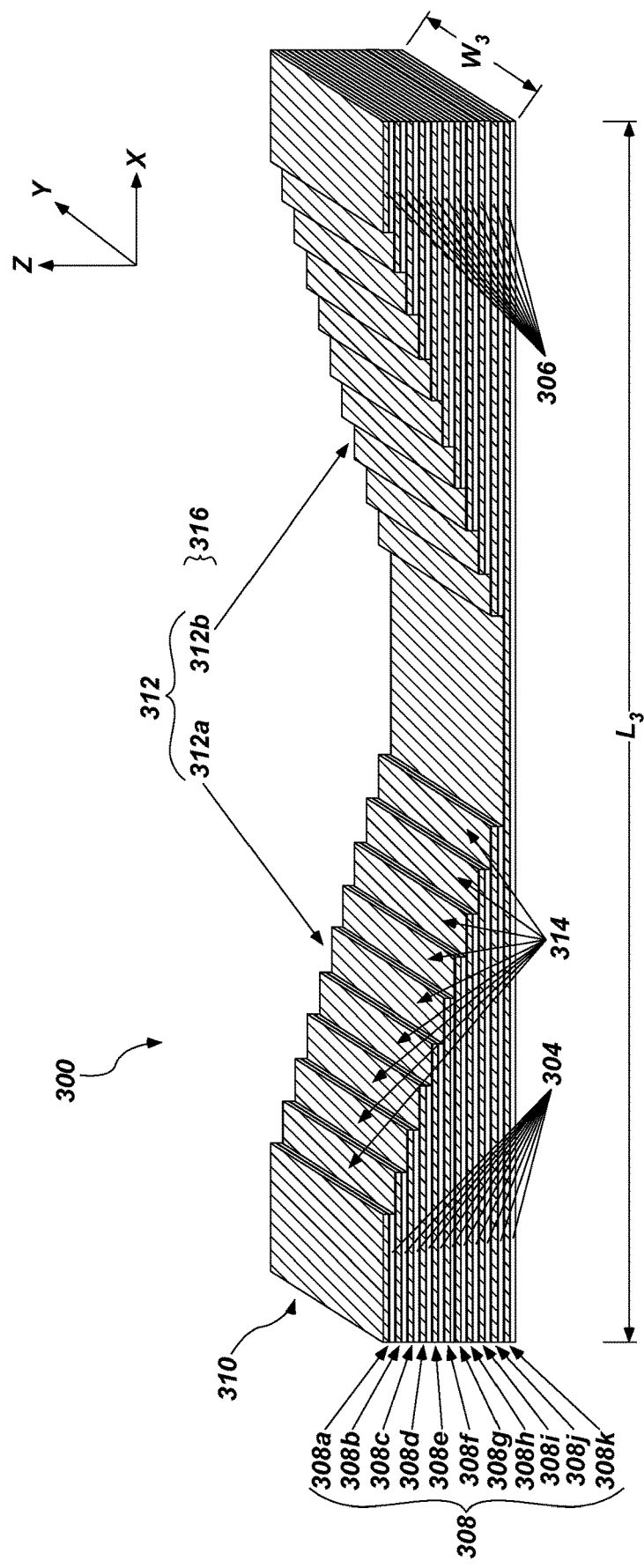

Referring to next to FIG. 3B, portions of the stack structure 302 (FIG. 3A) (e.g., portions of one or more of the tiers 308) may be subjected to at least one material removal process (e.g., one or more of a trimming process and a chopping process) to form a modified stack structure 310. The modified stack structure 310 may include one or more staircase structures 312 each independently formed of and including one or more steps 314. The steps 314 of the one or more staircase structures 312 may be at least partially defined by exposed portions of one or more of the tiers 308 remaining following the at least one material removal process.

The modified stack structure 310 may include a single (e.g., only one) staircase structure 312, or may include multiple (e.g., more than one) staircase structures 312. In some embodiments, the modified stack structure 310 includes multiple staircase structures 312. By way of non-limiting example, as shown in FIG. 3B, the modified stack structure 310 may include a stadium structure 316 including a forward staircase structure 312a, and a reverse staircase structure 312b that mirrors the forward staircase structure 312a. In additional embodiments, the modified stack structure 310 may exhibit one or more of a different number and different configuration of staircase structures 312. By way of non-limiting example, the modified stack structure 310 may include two or more stadium structures 316 in series with one another, may include one or more forward staircase structures (e.g., the forward staircase structure 312a) but not one or more reverse staircase structures (e.g., the reverse staircase structure 312b may be omitted), may include one or more reverse staircase structures (e.g., reverse staircase structure 312b) but not one or more forward staircase structures (e.g., the forward staircase structure 312a may be omitted), may include two or more forward staircase structures in series with one another, and/or may include two or more reverse staircase structures in series with one another.

Each of the staircase structures 312 included in the modified stack structure 310 may independently include a desired number of steps 314. The number of steps 314 included in each of the staircase structures 312 may be substantially the same as (e.g., equal to) or may be different than (e.g., less than, or greater than) the number of tiers 308 in the modified stack structure 310. In some embodiments, the number of steps 314 included in each of the staircase structures 312 is less than the number of tiers 308 in the modified stack structure 310. As a non-limiting example, as shown in FIG. 3B, each of the staircase structures 312 (e.g., the forward staircase structure 312a and the reverse staircase structure 312b) may include ten (10) steps 314 at least partially defined by ends of the eleven (11) tiers 308 (e.g., tiers 308a through 308k) of the modified stack structure 310. In additional embodiments, one or more of the staircase structures 312 may include a different number of steps 314 (e.g., less than ten (10) steps, greater than ten (10) steps). As a non-limiting example, if the modified stack structure 310 includes eleven (11) tiers 308, at least one of the staircase structures 312 may include five (5) steps 314 at least partially defined by ends of a relatively lower group of the tiers 308 (e.g., tier 308f through tier 308k), and at least one other of the staircase structures 312 may include five (5) steps 314 at least partially defined by ends of a relatively higher group of the tiers 308 (e.g., tiers 308a through 308e).

The dimensions of each of the steps 314 may independently be tailored to desired dimensions and positions of additional structures (e.g., conductive structures, conductive contact structures) and/or openings (e.g., slots) to be formed in, on, over, and/or adjacent to the steps 314 during subsequent processing of the semiconductor device structure 300, as described in further detail below. As shown in FIG. 3B, each of the steps 314 may exhibit substantially the same width W3 as the modified stack structure 310. In addition, each of the steps 314 may exhibit substantially the same length, or at least one of the steps 314 may exhibit a different length than at least one other of the steps 314.

The staircase structures 312 may be formed using conventional processes (e.g., conventional photolithography processes, conventional material removal processes) and conventional processing equipment, which are not described in detail herein. By way of non-limiting example, a photoresist structure may be formed on or over the stack structure 302 (FIG. 3A), the photoresist structure may be photolithographically processed (e.g., photoexposed and developed) to remove at least one width thereof, one or more of the tiers 308 may be etched (e.g., anisotropically etched, such as anisotropically dry etched) using the remaining portions of the photoresist structure as an etching mask, the photoresist structure may be subjected to additional photolithographic processing to remove at least one additional width thereof, at least another group of the tiers 308 (e.g., the previously etched tier(s) 308 and one or more additional tier(s) 308) may be etched using the new remaining portions of the photoresist structure as etching masks, and so on, until the modified stack structure 310 including the one or more staircase structures 312 is formed.

Figure 3C:
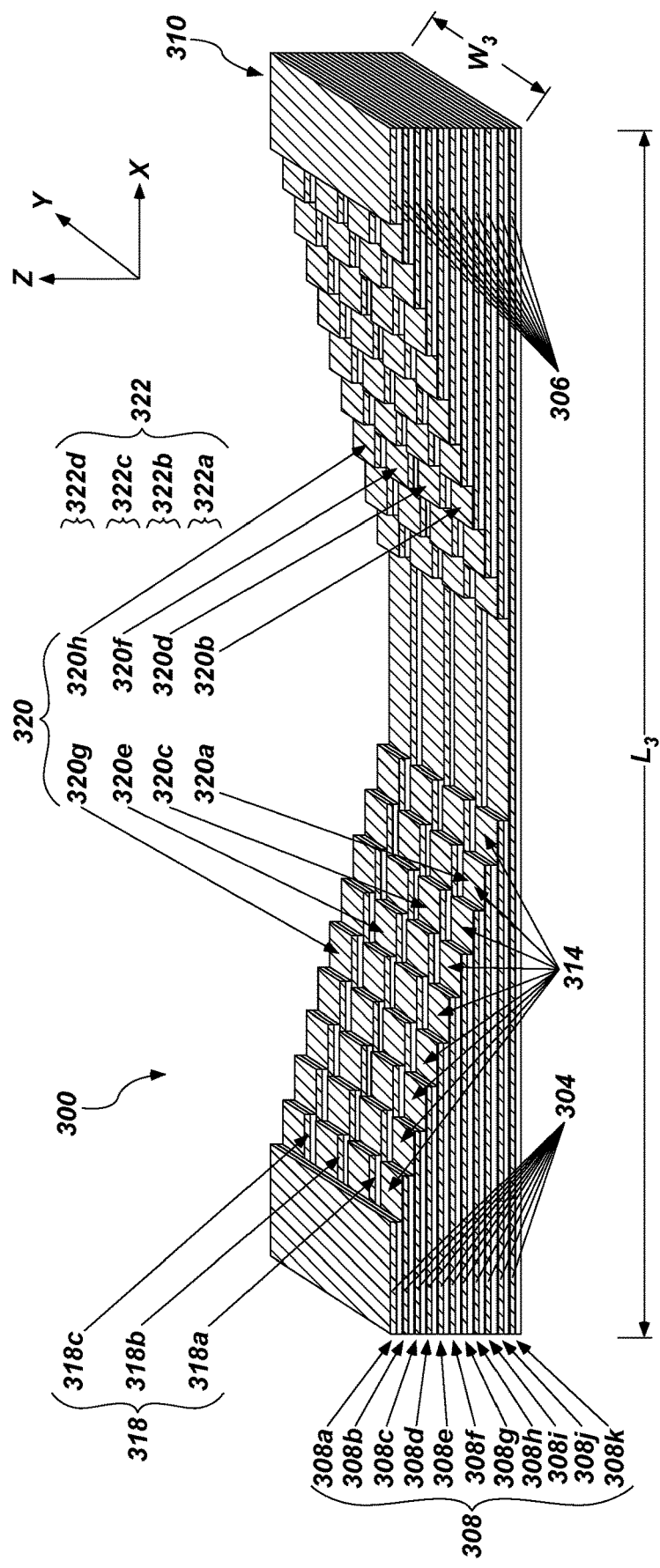

Referring next to FIG. 3C, one or more openings 318 (e.g., slots, apertures, slits) may be formed in the modified stack structure 310. The openings 318 may extend through (e.g., completely through) the modified stack structure 310, and may divide (e.g., segment) the staircase structures 312 (FIG. 3B) into additional staircase structures 320 exhibiting relatively smaller widths than the staircase structures 312. The one or more openings 318 may laterally intervene (e.g., in the Y-direction) between the additional staircase structures 320 and may continuously laterally extend (e.g., in the X-direction) across the entire lengths of the additional staircase structures 320.

Any desired number (e.g., quantity, amount) of openings 318 may be formed in the modified stack structure 310. The number of openings 318 may correspond to desired numbers and configurations (e.g., shapes, sizes, positions) of the additional staircase structures 320. A single (e.g., only one) opening 318 may be formed longitudinally through (e.g., in the Z-direction) and may extend continuously laterally across and between (e.g., in the X-direction) the staircase structures 312 (FIG. 3B) (e.g., the forward staircase structure 312a and the reverse staircase structure 312b of the stadium structure 316) of the modified stack structure 310, or multiple (e.g., more than one) openings 318 may be formed longitudinally through and may extend continuously laterally in parallel across and between the staircase structures 312 of the modified stack structure 310. As shown in FIG. 3C, in some embodiments, three (3) openings 318 are formed in the modified stack structure 310. The three (3) openings 318 may at least partially define and separate (e.g., in the Y-direction) four (4) additional stadium structures 322. A first opening 318a may be laterally disposed between a first additional stadium structure 322a and a second additional stadium structure 322b, a second opening 318b may be laterally disposed between the second additional stadium structure 322b and a third additional stadium structure 322c, and a third opening 318c may be laterally disposed between the third additional stadium structure 322c and a fourth additional stadium structure 322d. The first additional stadium structure 322a may include a first forward staircase structure 320a and a first reverse staircase structure 320b. The second additional stadium structure 322b may include a second forward staircase structure 320c and a second reverse staircase structure 320d. The third additional stadium structure 322c may include a third forward staircase structure 320e and a third reverse staircase structure 320f. The fourth additional stadium structure 322d may include a fourth forward staircase structure 320g and a fourth reverse staircase structure 320h. In additional embodiments, a different number of openings 318 (e.g., less than three (3) openings 318, or more than three (3) openings 318) may be formed longitudinally through and continuously laterally across and between the staircase structures 312 (FIG. 3B). By way of non-limiting example, two (2) openings 318 may be formed in the modified stack structure 310 to at least partially define and separate three (3) additional stadium structures 322, or one (1) opening 318 may be formed in the modified stack structure 310 to at least partially define and separate two (2) additional stadium structures 322.

The dimensions and spacing of the one or more openings 318 may be selected to provide desired dimensions (e.g., widths) to the additional staircase structures 320 (including steps 324 thereof), and to provide desired dimensions (e.g., widths) and spacing to conductive structures to be formed using the openings 318, as described in further detail below. If more than one opening 318 is formed in the modified stack structure 310, each of the openings 318 may exhibit substantially the same dimensions (e.g., substantially the same width, length, and height), or at least one of the openings 318 may exhibit one or more different dimensions (e.g., a different width, a different length, and/or a different height) than at least one other of the openings 318. In some embodiments, each of the openings 318 exhibits substantially the same dimensions. In addition, if more than two (2) openings 318 are formed in the modified stack structure 310, adjacent openings 318 may be substantially uniformly (e.g., evenly) spaced apart from one another, or may be non-uniformly (non-evenly) spaced apart from one another. In some embodiments, adjacent openings 318 are substantially uniformly spaced apart from one another. The openings 318 may be symmetrically distributed across the modified stack structure 310, or may be asymmetrically distributed across the modified stack structure 310.

The openings 318 may be formed in the modified stack structure 310 using one or more conventional material removal processes, which are not described in detail herein. For example, one or more portions of the modified stack structure 310 may be subjected to at least one etching process (e.g., at least one dry etching process, such as at least one of an RIE process, a deep RIE process, a plasma etching process, a reactive ion beam etching process, and a chemically assisted ion beam etching process; at least one wet etching process, such as at least one of a hydrofluoric acid etching process, a buffered hydrofluoric acid etching process, and a buffered oxide etching process) to form the openings 318 in the modified stack structure 310.

Figure 3D:
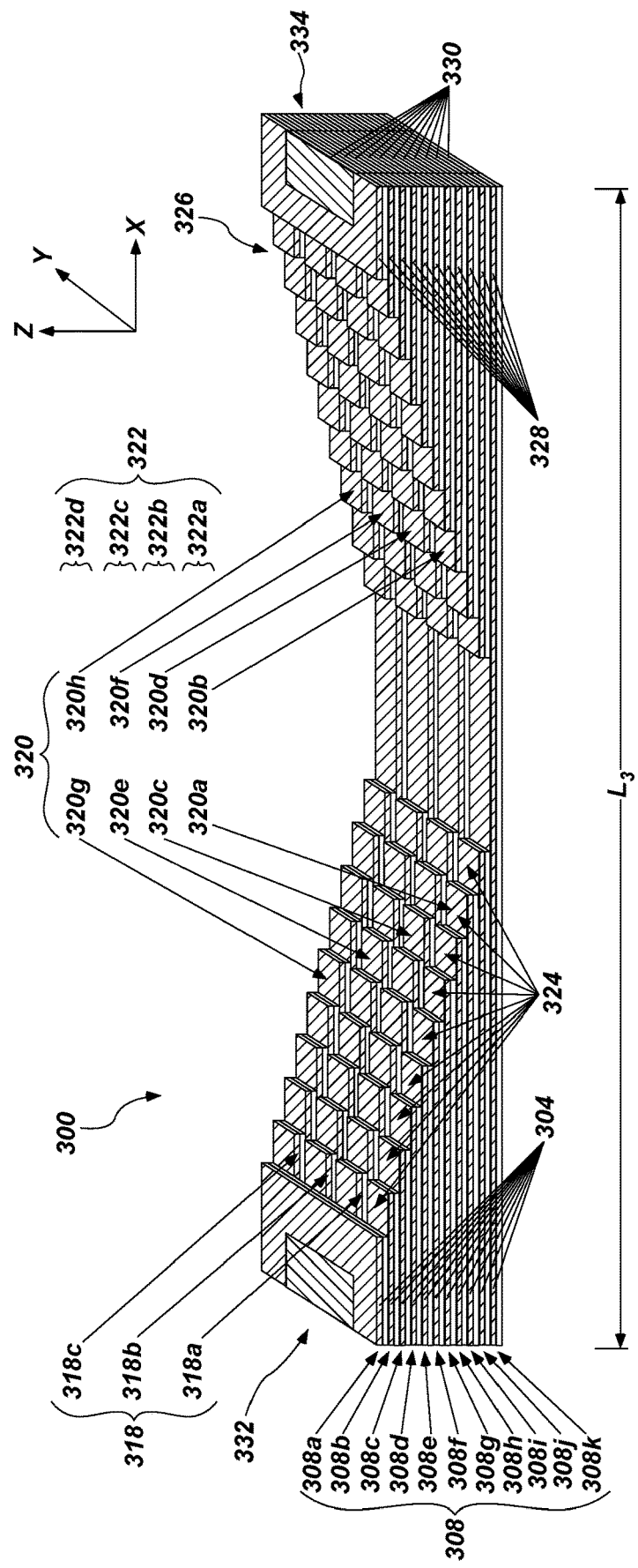

Referring to FIG. 3D, portions of the additional insulating structures 306 (FIG. 3C) may be selectively removed, and may be replaced with conductive material to form a conductive stack structure 326. As shown in FIG. 3D, each of the tiers 308 of the conductive stack structure 326 may include one or more conductive structures 328 (e.g., conductive gates, conductive plates) extending (e.g., in the X-direction and/or the Y-direction) into lateral surfaces thereof. The one or more conductive structures 328 of each tier 308 of the conductive stack structure 326 may at least partially (e.g., substantially) laterally surround remaining portions 330 (e.g., unremoved portions) of the additional insulating structures 306.

The conductive structures 328 may follow (e.g., route along) lateral (e.g., side) surfaces of the conductive stack structure 326. For example, the conductive structures 328 may extend into and along outer lateral surfaces (e.g., peripheral lateral surfaces) of the tiers 308, as well as into and along inner lateral surfaces of the tiers 308 (e.g., lateral surfaces at least partially defined by the openings 318 longitudinally extending through the tiers 308). Portions of at least some of the conductive structures 328 may laterally extend (e.g., in the X-direction) to and at least partially define the additional staircase structures 320 of the conductive stack structure 326 to form conductive contact regions (e.g., landing pad regions) for at least some of the tiers 308. In addition, in tiers 308 longitudinally below the additional staircase structures 320 (e.g., untrimmed tiers 308 and/or unchopped tiers 308), the conductive structures 328 thereof may laterally extend to and may completely surround the openings 318 to form one or more continuous conductive paths between a first end 332 of the conductive stack structure 326 and a second, opposing end 334 of the conductive stack structure 326. The first end 332 and the second, opposing end 334 of the conductive stack structure 326 may each be coupled to other components of a semiconductor device (e.g., a memory device) including the semiconductor device structure 300, such as one or more memory cell arrays (e.g., vertical memory cell arrays).

As shown in FIG. 3D, the conductive stack structure 326 may include multiple (e.g., more than one) conductive structures 328 in each of the tiers 308 defining the additional staircase structures 320. For example, for each of the tiers 308 defining the additional stadium structures 322, at least one conductive structure 328 may at least partially define the steps 324 of each of the forward staircase structures (e.g., each of the first forward staircase structure 320a, the second forward staircase structure 320c, the third forward staircase structure 320e, and the fourth forward staircase structure 320g), and at least one other conductive structure 328 may at least partially define the steps 324 of each of the reverse staircase structures (e.g., each of the first reverse staircase structure 320b, the second reverse staircase structure 320d, the third reverse staircase structure 320f, and the fourth reverse staircase structure 320h). The conductive structure 328 at least partially defining the steps 324 of each of the forward staircase structures may extend laterally inward from the first end 332 of the conductive stack structure 326, and may partially surround sides of each of the openings 318 (e.g., the first opening 318a, the second opening 318b, and the third opening 318c). The other conductive structure 328 at least partially defining the steps 324 of each of the reverse staircase structures may extend laterally inward from the second, opposing end 334 of the conductive stack structure 326, and may also partially surround sides of each of the openings 318. In some embodiments, for each of the tiers 308 defining the additional staircase structures 320, a single (e.g., only one) conductive structure 328 extends laterally inward from the first end 332 of the conductive stack structure 326, and a single (e.g., only one) other conductive structure 328 extends laterally inward from the second, opposing end 334 of the conductive stack structure 326. In additional embodiments, for one or more of the tiers 308 defining the additional staircase structures 320, multiple (e.g., more than one) conductive structures 328 extend laterally inward from the first end 332 of the conductive stack structure 326, and/or multiple other conductive structures 328 extend laterally inward from the second, opposing end 334 of the conductive stack structure 326. By way of non-limiting example, in some embodiments wherein the second opening 318b is omitted (e.g., absent), one or more of the tiers 308 may individually include at least two (2) of the conductive structures 328 extending laterally inward from the first end 332, and/or at least two (2) of the conductive structures 328 extending laterally inward from the second, opposing end 334. In such embodiments, the at least two (2) of the conductive structures 328 extending laterally inward from the first end 332 may be separated (e.g., isolated) from one another by a remaining portion of one of the additional insulating structures 306 (FIG. 3C), and/or the at least two (2) of the conductive structures 328 extending laterally inward from the second, opposing end 334 may be separated (e.g., isolated) from one another by a remaining portion of one of the additional insulating structures 306 (FIG. 3C).

For tiers 308 (e.g., untrimmed tiers 308 and/or unchopped tiers 308) longitudinally below those defining the additional staircase structures 320, each tier 308 may include a single (e.g., only one) conductive structure 328, or one or more tiers 308 may individually include multiple (e.g., more than one) conductive structures 328. In some embodiments, each of the tiers 308 longitudinally below those defining the additional staircase structures 320 includes a single conductive structure 328. The single conductive structure 328 may extend laterally inward from the first end 332 and the second, opposing end 334 of the conductive stack structure 326 along outer lateral surfaces of the conductive stack structure 326, and may substantially completely surround each of the openings 318 (e.g., each of the first opening 318a, the second opening 318b, and the third opening 318c) to form a continuous conductive path extending from the first end 332 of the conductive stack structure 326 to the second, opposing end 334 of the of the conductive stack structure 326. In additional embodiments, one or more of the tiers 308 longitudinally below those defining the additional staircase structures 320 individually include multiple conductive structures 328. By way of non-limiting example, in some embodiments wherein the second opening 318b is omitted (e.g., absent), one or more of the tiers 308 longitudinally below those defining the additional staircase structures 320 may individually include at least two (2) conductive structures 328 extending laterally inward from the first end 332 and the second, opposing end 334 of the conductive stack structure 326. In such embodiments, the at least two (2) conductive structures 328 may be separated (e.g., isolated) from one another by a remaining portion of one of the additional insulating structures 306 (FIG. 3C).

The dimensions and shapes of the conductive structures 328 may directly correspond to the dimensions and shapes of the removed portions of the additional insulating structures 306 (FIG. 3C). A width (e.g., lateral depth within the conductive stack structure 326) of each of the conductive structures 328 may be substantially uniform across the entire path (e.g., route) of the conductive structure 328, or the width of at least one of the conductive structures 328 may be substantially non-uniform (e.g., variable) across different portions of the path of the conductive structure 328. In some embodiments, portions of the conductive structures 328 laterally extending (e.g., in the X-direction) to and at least partially defining the additional staircase structures 320 may exhibit substantially the same width as other portions (e.g., insulating structure 304 portions) of the additional staircase structures 320. In addition, each of the conductive structures 328 may exhibit a different shape and at least one different dimension than each other of the conductive structures 328, or at least one of the conductive structures 328 may exhibit one or more of substantially the same shape and substantially the same dimensions as at least one other of the conductive structures 328. By way of non-limiting example, as shown in FIG. 3D, conductive structures 328 of different tiers 308 may exhibit different shapes and different dimensions (e.g., different lengths associated with the locations of the different steps 324 of the additional staircase structures 320) than one another, but conductive structures 328 within the same tier 308 may exhibit substantially the same shapes and substantially the same dimensions as one another (e.g., conductive structures 328 within the same tier 308 may be mirror images of one another). In additional embodiments, conductive structures 328 of two or more different tiers 308 may exhibit substantially the same shapes and substantially the same dimensions as one another. In further embodiments, conductive structures 328 within the same tier 308 may exhibit one or more of a different shape and at least one different dimension than one another.

The conductive structures 328 may be formed of and include at least one conductive material, such as a metal, a metal alloy, a conductive metal oxide, a conductive metal nitride, a conductive metal silicide, a conductively-doped semiconductor material, or combinations thereof. By way of non-limiting example, the conductive structures 328 may be formed of and include at least one of tungsten W, WN, Ni, Ta, TaN, TaSi, Pt, Cu, Ag, Au, Al, Mo, Ti, TiN, TiSi, TiSiN, TiAlN, MoN, Ir, IrO$_x$, Ru, RuO$_x$, and conductively-doped silicon. In some embodiments, the conductive structures 328 are formed of and include W.

The conductive structures 328 may be formed by selectively removing portions of the additional insulating structures 306 (FIG. 3C) relative to the insulating structures 304 to form recessed regions laterally extending into each of the tiers 308, and then at least partially (e.g., substantially)

filling the recessed regions with at least one conductive material. The recessed regions may be formed by subjecting the modified stack structure 310 (FIG. 3C) to at least one etching processing (e.g., an isotropic etching process) employing an etch chemistry in which the insulative material of the additional insulating structures 306 is selectively removed relative to that of the insulating structures 304. By way of non-limiting example, if the insulating structures 304 are formed of and include silicon dioxide ($SiO_2$), and the additional insulating structures 306 are formed of and include silicon nitride ($Si_3N_4$), the modified stack structure 310 may be exposed to an etchant comprising phosphoric acid ($H_3O_4P$) to selectively remove portions of the additional insulating structures 306 adjacent exposed lateral surfaces (e.g., exposed outer lateral surfaces, exposed inner lateral surfaces at least partially defined by the openings 318) of the modified stack structure 310. Thereafter, the conductive material may be formed (e.g., delivered, deposited) within recessed regions to form the conductive structures 328.

In additional embodiments, rather than selectively removing and replacing portions of the additional insulating structures 306 (FIG. 3C) to form the conductive stack structure 326, portions of the insulating structures 304 may instead be selectively removed and replaced with a conductive material to form a conductive stack structure. Aside from the sequence (e.g., order) of the alternating conductive structures and insulating structures of such a conductive stack structure and differences (if any) associated with material properties of the insulating structures 304 as compared to those of the additional insulating structures 306, such a conductive stack structure may be substantially similar to and may have little or no difference in terms of functionality and/or operability as compared to the conductive stack structure 326 depicted in FIG. 3D.

Figure 3E:
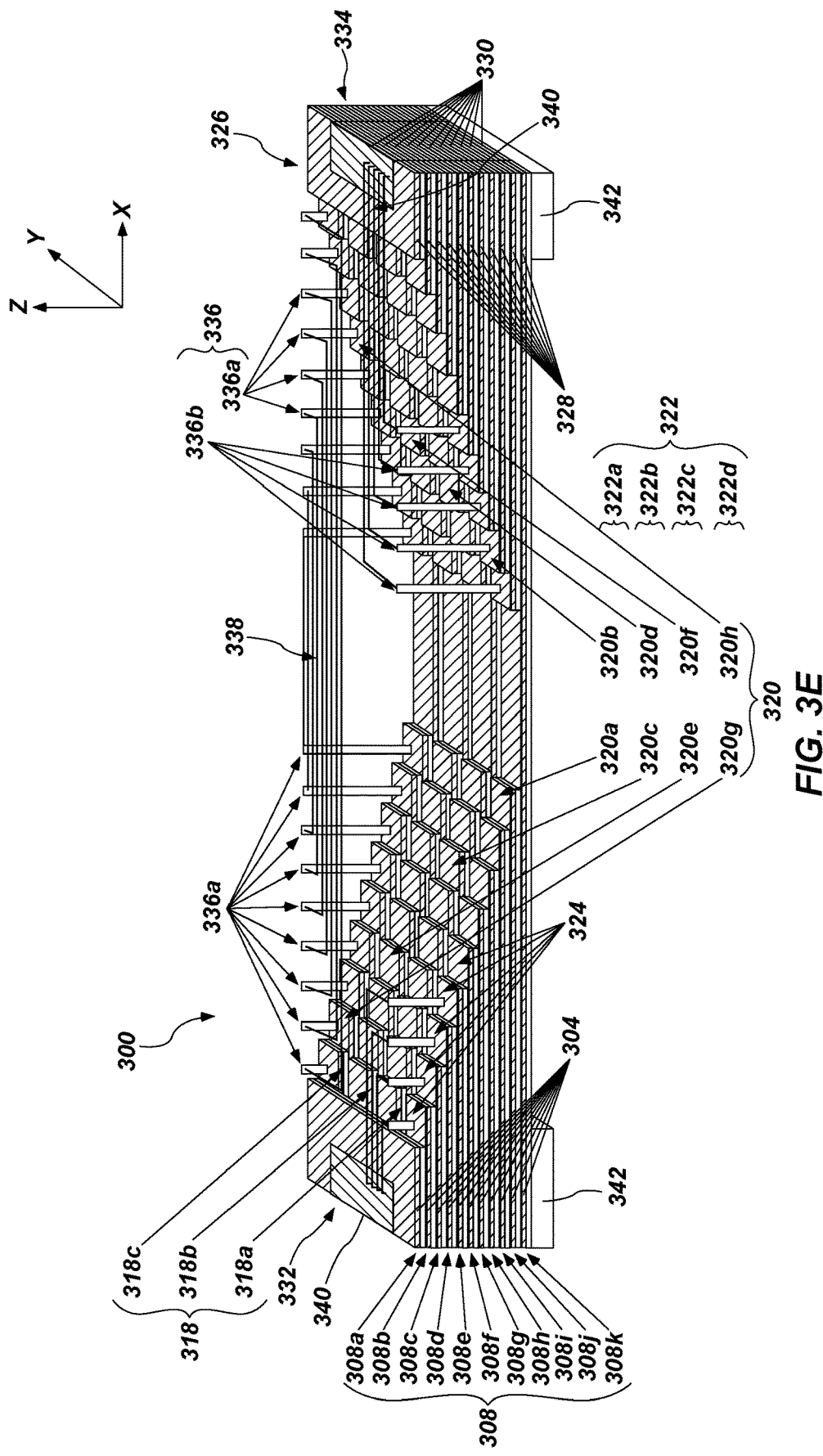
Figure 3F:
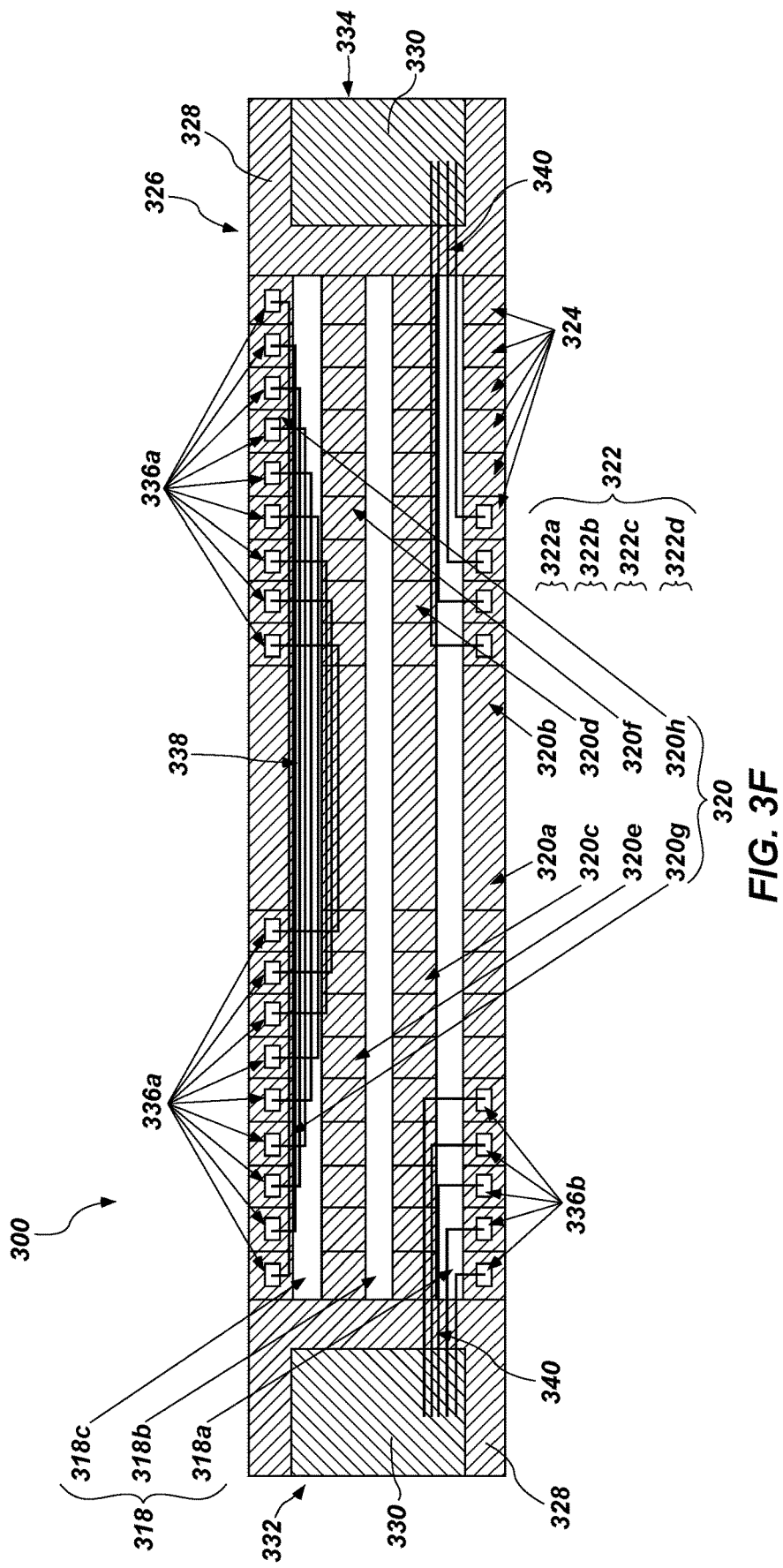

Referring next to FIG. 3E, conductive contact structures 336 (e.g., conductive plugs, conductive vertical interconnects) may be formed on, over, and/or within the one or more of the additional staircase structures 320 of the conductive stack structure 326, conductive routing structures 338 (e.g., conductive interconnects, conductive bridges) may be formed on and between some of the conductive contact structures 336 to electrically connect separate (e.g., discrete, isolated) conductive structures 328 of one or more of the tiers 308, and additional conductive routing structures 340 may be formed on and between other of the conductive contact structures 336 and at least one string driver device 342 to electrically connect the conductive structures 328 of one or more of the tiers 308 to the string driver device 342. FIG. 3F is a top-down view of the semiconductor device structure 300 at the processing stage depicted in FIG. 3E.

The conductive contact structures 336 may be coupled to the conductive structures 328 of the tiers 308 of the conductive stack structure 326 at the steps 324 of the additional staircase structures 320. Each of the tiers 308 (e.g., each of the tiers 308*a* through 308*k*) may have one or more of the conductive contact structures 336 coupled to the conductive structures 328 thereof, or less than all of the tiers 308 (e.g., less than all of the tiers 308*a* through 308*k*, such as only tiers 308*b* through 308*j*) may have one or more of the conductive contact structures 336 coupled to the conductive structures 328 thereof.

As shown in FIG. 3E, each of the tiers 308 having conductive contact structures 336 coupled thereto may include at least two (2) first conductive contact structures 336*a* positioned to electrically connect (with the use of at least one of the conductive routing structures 338) separate conductive structures 328 of the tier 308. For example, for each of the tiers 308 defining the additional stadium structures 322, at least one first conductive contact structure 336*a* may be coupled to at least one conductive structure 328 of the tier 308 at a step 324 of at least one forward staircase structure (e.g., one or more of the first forward staircase structure 320*a*, the second forward staircase structure 320*c*, the third forward staircase structure 320*e*, and the fourth forward staircase structure 320*g*), and at least one additional first conductive contact structure 336*a* may be coupled to at least one other conductive structure 328 of the tier 308 at a step 324 of at least one reverse staircase structure (e.g., one or more of the first reverse staircase structure 320*b*, the second reverse staircase structure 320*d*, the third reverse staircase structure 320*f*, and the fourth reverse staircase structure 320*h*). By way of non-limiting example, as depicted in FIG. 3E, for each of the tiers 308 defining the additional stadium structures 322, a first conductive contact structure 336*a* may be coupled to a first conductive structure 328 of the tier 308 at a step 324 of the fourth forward staircase structure 320*g* of the fourth additional stadium structure 322*d*, and another first conductive contact structure 336*a* may be coupled to a second conductive structure 328 of the tier 308 at a step 324 of the fourth reverse staircase structure 320*h* of the fourth additional stadium structure 322*d*.

In addition, as shown in FIG. 3E, each of the tiers 308 having conductive contact structures 336 coupled thereto may include one or more second conductive contact structures 336*b* positioned to electrically connect (with the use of at least one of the additional conductive routing structures 340) the conductive structures 328 of the tier 308 to at least one of the string driver devices 342. For example, for each of the tiers 308 defining the additional stadium structures 322, at least one second conductive contact structure 336*b* may be coupled to at least one conductive structure 328 of the tier 308 at a step 324 of at least one of the additional staircase structures 320 (e.g., one or more of the first forward staircase structure 320*a*, the first reverse staircase structure 320*b*, the second forward staircase structure 320*c*, the second reverse staircase structure 320*d*, the third forward staircase structure 320*e*, the third reverse staircase structure 320*f*, the fourth forward staircase structure 320*g*, and the fourth reverse staircase structure 320*h*). By way of non-limiting example, as depicted in FIG. 3E, for each of the tiers 308 defining the additional stadium structures 322, a second conductive contact structure 336*b* may be coupled to at least one of the conductive structures 328 of the tier 308 at one or more of a step 324 of the first forward staircase structure 320*a* of the first additional stadium structure 322*a* and a step 324 of the first reverse staircase structure 320*b* of the first additional stadium structure 322*a*.

The second conductive contact structures 336*b* may be formed on or over a single (e.g., only one) additional staircase structure 320 of the conductive stack structure 326, or may be formed on or over multiple (e.g., more than one) additional staircase structures 320 of the conductive stack structure 326. By way of non-limiting example, as shown in FIGS. 3E and 3F, within at least one of the additional stadium structures 322 (e.g., one or more of the first additional stadium structure 322*a*, the second additional stadium structure 322*b*, the third additional stadium structure 322*c*, and the fourth additional stadium structure 322*d*) of the conductive stack structure 326, a portion of the second conductive contact structures 336*b* may be formed on or over a forward staircase structure (e.g., the first forward staircase structure 320*a*, the second forward staircase structure 320c, the third forward staircase structure 320e, the fourth forward staircase structure 320g) and an additional portion of the second conductive contact structures 336b may be formed on or over a reverse staircase structure (e.g., the first reverse staircase structure 320b, the second reverse staircase structure 320d, the third reverse staircase structure 320f, the fourth reverse staircase structure 320h). In additional embodiments, within at least one of the additional stadium structures 322, each of the second conductive contact structures 336b may be formed on or over a forward staircase structure (e.g., the first forward staircase structure 320a, the second forward staircase structure 320c, the third forward staircase structure 320e, the fourth forward staircase structure 320g). In further embodiments, within at least one of the additional stadium structures 322, each of the second conductive contact structures 336b may be formed on or over a reverse staircase structure (e.g., the first reverse staircase structure 320b, the second reverse staircase structure 320d, the third reverse staircase structure 320f, the fourth reverse staircase structure 320h).

Conductive contact structures 336 (e.g., first conductive contact structures 336a, second conductive contact structures 336b) formed on or over the same additional staircase structure 320 may be substantially uniformly (e.g., evenly) spaced apart from one another, or may be non-uniformly (e.g., unevenly) spaced apart from one another. Conductive contact structures 336 formed on or over the same additional staircase structure 320 may be formed to be generally centrally positioned (e.g., in at least the X-direction) on or over the steps 324 associated therewith. Accordingly, distances between adjacent conductive contact structures 336 located on or over the same additional staircase structure 320 may vary in accordance with variance in the lengths (e.g., in the X-direction) of the adjacent steps 324 associated with the adjacent conductive contact structures 336. In addition, conductive contact structures 336 formed on or over the same additional staircase structure 320 may be substantially aligned with one another (e.g., not offset from one another in the Y-direction), or may be at least partially non-aligned with one another (e.g., offset from one another in the Y-direction).

The conductive contact structures 336 may be formed of and include at least one conductive material, such as a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or combinations thereof. Each of the conductive contact structures 336 may have substantially the same material composition, or at least one of the conductive contact structures 336 may have a different material composition than at least one other of the conductive contact structures 336.

With continued reference to FIGS. 3E and 3F, the conductive routing structures 338 may be coupled (e.g., attached, connected) to and extend between portions of the conductive contact structures 336 (e.g., portions of the first conductive contact structures 336a). The conductive routing structures 338 may form a conductive path between (e.g., electrically connect) electrically isolated conductive structures 328 of one or more of the tiers 308 (FIG. 3E) of the conductive stack structure 326. For example, for each of the tiers 308 defining the additional stadium structures 322, the combination of the first conductive contact structures 336a and the conductive routing structures 338 may electrically connect at least one conductive structure 328 of the tier 308 located proximate the first end 332 of the conductive stack structure 326 to at least one other conductive structure 328 of the tier 308 located proximate the second, opposing end 334 of the conductive stack structure 326.

The conductive routing structures 338 may extend from a portion of the conductive contact structures 336 (e.g., a portion of the first conductive contact structures 336a) located proximate the first end 332 of the conductive stack structure 326, over one or more sections of the conductive stack structure 326, and to other portions of the conductive contact structures 336 (e.g., another portion of the first conductive contact structures 336a) located proximate the second, opposing end 334 of the conductive stack structure 326. For example, for each of the tiers 308 defining the additional stadium structures 322, at least one conductive routing structure 338 extends from at least one first conductive contact structure 336a positioned on or over a step 324 of at least one forward staircase structure (e.g., one or more of the first forward staircase structure 320a, the second forward staircase structure 320c, the third forward staircase structure 320e, and the fourth forward staircase structure 320g) to at least one other first conductive contact structure 336a positioned on or over a step 324 of at least one reverse staircase structure (e.g., one or more of the first reverse staircase structure 320b, the second reverse staircase structure 320d, the third reverse staircase structure 320f, and the fourth reverse staircase structure 320h). By way of non-limiting example, as shown in FIGS. 3E and 3F, for each of the tiers 308 defining the additional stadium structures 322, a conductive routing structure 338 may extend from a first conductive contact structure 336a located on or over a step 324 of the fourth forward staircase structure 320g of the fourth additional stadium structure 322d to another first conductive contact structure 336a located on or over a step 324 of the fourth reverse staircase structure 320h of the fourth additional stadium structure 322d.

With continued reference to FIG. 3E, the additional conductive routing structures 340 may be coupled (e.g., attached, connected) to portions of the conductive contact structures 336 (e.g., portions of the second conductive contact structures 336b) and at least one string driver device 342. The string driver device 342 may be formed of and include a plurality of switching devices (e.g., transistors). Suitable designs and configurations for the string driver device 342 are well known in the art, and are therefore not described in detail herein. The string driver device 342 may, for example, underlie one or more portions (e.g., central portions, peripheral portions, combinations thereof) of the conductive stack structure 326. The combination of the conductive contact structures 336 (e.g., the first conductive contact structures 336a and the second conductive contact structures 336b), the conductive routing structures 338, and the additional conductive routing structures 340 may electrically connect the conductive structures 328 of one or more of the tiers 308 to the string driver device 342, facilitating application of voltages to the conductive structures 328 using the string driver device 342. The continuous conductive paths across the conductive stack structure 326 (e.g., from the first end 332 to the second, opposing end 334) provided by the configurations and positions of the conductive structures 328, the conductive contact structures 336 (e.g., the first conductive contact structures 336a), and the conductive routing structures 338 may permit an individual (e.g., single) switching device (e.g., transistor) of the string driver device 342 to drive voltages completely across (e.g., from the first end 332 to the second, opposing end 334) and/or in opposing directions across (e.g., toward the first end 332 and toward the second, opposing end 334) an individual tier 308 electrically connected thereto.

The additional conductive routing structures 340 may extend from the conductive contact structures 336 (e.g., the second conductive contact structures 336b), over one or more sections of the conductive stack structure 326, through one or more additional sections of the conductive stack structure 326, and to one or more of the string driver devices 342. By way of non-limiting example, as shown in FIG. 3E, the additional conductive routing structures 340 may extend from the second conductive contact structures 336b, laterally over a middle section of the conductive stack structure 326, longitudinally through insulating sections of the tiers 308 including the remaining portions 330 of the additional insulating structures 306 (FIG. 3C) and portions of the insulating structures 304, and to the string driver devices 342. In addition, each of the additional conductive routing structures 340 may extend to the same string driver device 342, or at least one of the additional conductive routing structures 340 may extend to a different string driver device 342 than at least one other of the additional conductive routing structures 340.

The conductive routing structures 338 and the additional conductive routing structures 340 may be formed of and include at least one conductive material, such as a metal (e.g., W, Ti, Mo, Nb, V, Hf, Ta, Cr, Zr, Fe, Ru, Os, Co, Rh, Ir, Ni, Pd, Pt, Cu, Ag, Au, Al), a metal alloy (e.g., a Co-based alloy, an Fe-based alloy, a Ni-based alloy, an Fe- and Ni-based alloy, a Co- and Ni-based alloy, an Fe- and Cu-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide, a conductively-doped semiconductor material (e.g., conductively-doped silicon, conductively-doped germanium, conductively-doped silicon germanium), or combinations thereof. Each of the conductive routing structures 338 and each of the additional conductive routing structures 340 may have substantially the same material composition, or one or more of the conductive routing structures 338 and the additional conductive routing structures 340 may have a different material composition than one or more other of the conductive routing structures 338 and the additional conductive routing structures 340.

The conductive contact structures 336, the conductive routing structures 338, the additional conductive routing structures 340, and the string driver devices 342 may each independently be formed using conventional processes (e.g., conventional deposition processes, conventional photolithography processes, conventional material removal processes) and conventional processing equipment, which are not described in detail herein.

Thus, in accordance with embodiments of the disclosure, a method of forming a semiconductor device structure comprises forming a stack structure comprising stacked tiers each comprising an insulating structure and an additional insulating structure longitudinally adjacent the insulating structure. Portions of the stacked tiers of the stack structure are removed to form at least one stadium structure comprising opposing staircase structures. At least one opening is formed to extend through the stacked tiers and continuously across an entire length of the at least one stadium structure to form additional stadium structures each comprising additional opposing staircase structures having steps comprising lateral ends of the stacked tiers. Portions of the additional insulating structure of each of the stacked tiers are replaced with at least one conductive material to form conductive structures in each of the stacked tiers. The conductive contact structures are coupled to the conductive structures of the stacked tiers at steps of the additional opposing staircase structures of at least one of the additional stadium structure. Conductive routing structures are coupled to and completely between pairs of the conductive contact structures to form at least one continuous conductive path extending completely across each of the stacked tiers.

In addition, in accordance with additional embodiments of the disclosure, a semiconductor device structure comprises stacked tiers each comprising conductive structures and insulating structures longitudinally adjacent the conductive structures; stadium structures each comprising opposing staircase structures having steps comprising lateral ends of the stacked tiers, at least one opening laterally intervening between at least two of the stadium structures; the at least one opening extending through the stacked tiers and continuously across entire lengths of the at least two stadium structures; conductive contact structures coupled to the conductive structures of the stacked tiers at steps of the opposing staircase structures of at least one of the stadium structures; and conductive routing structures coupled to and extending completely between pairs of the conductive contact structures to form at least one continuous conductive path extending completely across each of the stacked tiers.

Figure 4:
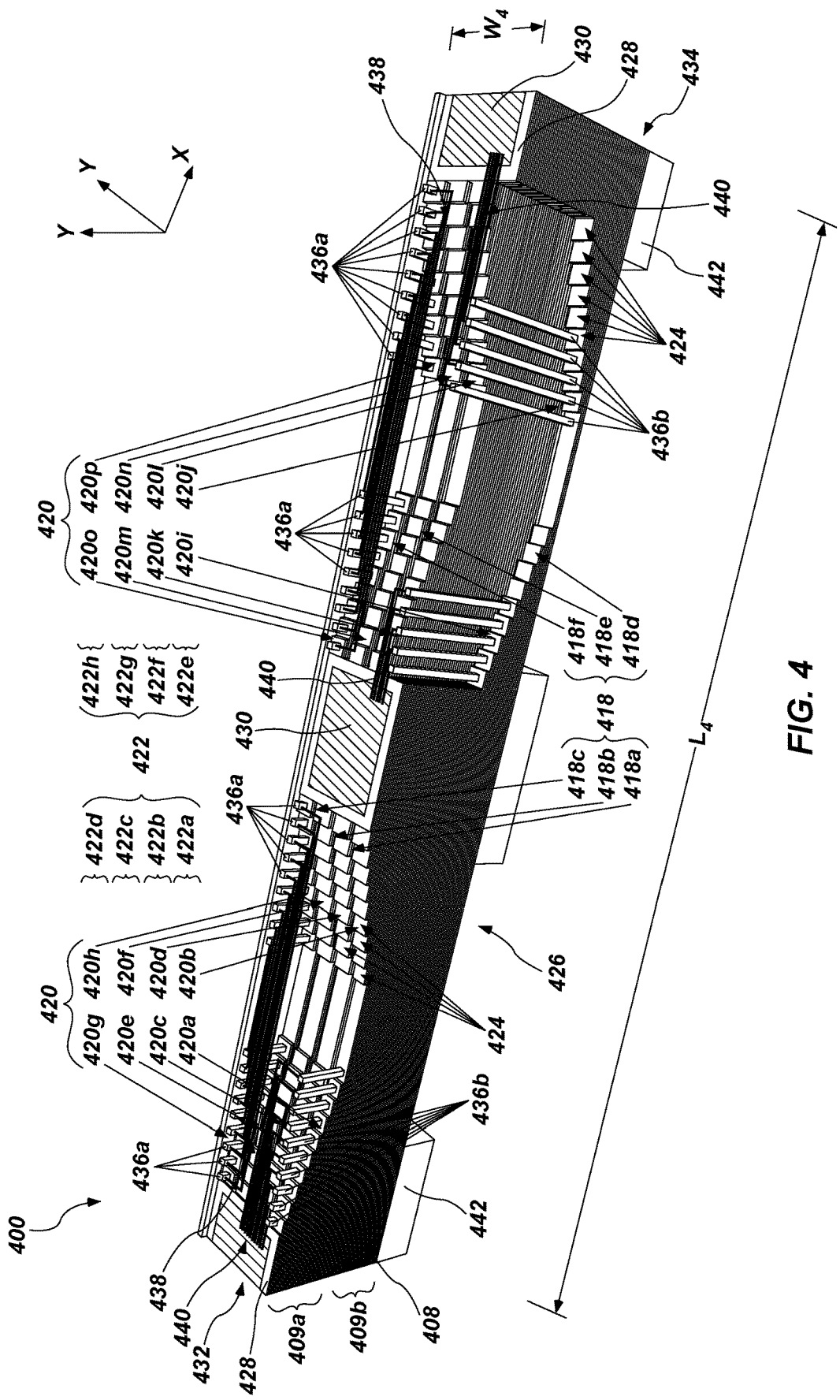
FIG. 4 is a perspective view of a semiconductor device structure, in accordance with additional embodiments of the disclosure.

One of ordinary skill in the art will appreciate that, in accordance with additional embodiments of the disclosure, the features and feature configurations described above in relation to FIGS. 3A-3F may be readily adapted to the design needs of different semiconductor devices (e.g., different memory devices, such as different 3D NAND Flash memory devices). By way of non-limiting example, FIG. 4 illustrates a semiconductor device structure 400 in accordance with another embodiment of the disclosure. The semiconductor device structure 400 may have similar features and functionalities to the semiconductor device structure 300 previously described. However, the semiconductor device structure 400 may, for example, include a relatively greater number of tiers 408, as well one or more additional features (e.g., additional openings, additional staircase structures, additional conductive contact structures, additional conductive routing structures) and/or feature configurations (e.g., sizes, shapes, arrangements) to account for the relatively greater number of tiers 408. To avoid repetition, not all features shown in FIG. 4 are described in detail herein. Rather, unless described otherwise below, features designated by a reference numeral that is a 100 increment of the reference numeral of a feature described previously in relation to one or more of FIGS. 3A-3F will be understood to be substantially similar to the feature described previously.

As shown in FIG. 4, the semiconductor device structure 400 may include a conductive stack structure 426 exhibiting an alternating sequence of insulating structures and conductive structures 428 arranged in tiers 408. For clarity, the insulating structures of each of the tiers 408 are not depicted FIG. 4. However, aside from variances in shape and size, the insulating structures of the conductive stack structure 426 may be substantially similar to, and may be formed and arranged in substantially the manner as, the insulating structures 304 previously described in relation to the conductive stack structure 326. The conductive stack structure 426 may include a greater number of tiers 408 than the number of the tiers 308 included in the conductive stack structure 326 of the semiconductor device structure 300 previously described in relation to FIGS. 3E and 3F.

The conductive stack structure 426 may include multiple (e.g., more than one) staircase structures 420. For example, the conductive stack structure 426 may include multiple stadium structures 422 each including opposing staircase structures 420. The multiple stadium structures 422 may be positioned in series and in parallel with one another. By way of non-limiting example, as shown in FIG. 4, the conductive stack structure 426 may include a first stadium structure 422a, a second stadium structure 422b, a third stadium structure 422c, a fourth stadium structure 422d, a fifth stadium structure 422e, a sixth stadium structure 422f, a seventh stadium structure 422g, and an eighth stadium structure 422h. The first stadium structure 422a may include a first forward staircase structure 420a, and a first reverse staircase structure 420b that mirrors the first forward staircase structure 420a. The second stadium structure 422b may extend parallel (e.g., in the X-direction) to the first stadium structure 422a, and may include a second forward staircase structure 420c, and a second reverse staircase structure 420d that mirrors the second forward staircase structure 420c. The third stadium structure 422c may also extend parallel (e.g., in the X-direction) to the first stadium structure 422a, and may include a third forward staircase structure 420e, and a third reverse staircase structure 420f that mirrors the third forward staircase structure 420e. The fourth stadium structure 422d may also extend parallel (e.g., in the X-direction) to the first stadium structure 422a, and may include a fourth forward staircase structure 420g, and a fourth reverse staircase structure 420h that mirrors the fourth forward staircase structure 420g. The fifth stadium structure 422e may extend in series (e.g., in the X-direction) to the first stadium structure 422a, and may include a fifth forward staircase structure 420i, and a fifth reverse staircase structure 420j that mirrors the fifth forward staircase structure 420i. The sixth stadium structure 422f may extend in parallel (in the X-direction) with the fifth stadium structure 422e and in series (e.g., in the X-direction) to the second stadium structure 422b, and may include a sixth forward staircase structure 420k, and a sixth reverse staircase structure 420l that mirrors the sixth forward staircase structure 420k. The seventh stadium structure 422g may extend in parallel (in the X-direction) with the fifth stadium structure 422e and in series (e.g., in the X-direction) to the third stadium structure 422c, and may include a seventh forward staircase structure 420m, and a seventh reverse staircase structure 420n that mirrors the seventh forward staircase structure 420m. The eighth stadium structure 422h may extend in parallel (in the X-direction) with the fifth stadium structure 422e and in series (e.g., in the X-direction) to the fourth stadium structure 422d, and may include an eighth forward staircase structure 420o, and an eighth reverse staircase structure 420p that mirrors the eighth forward staircase structure 420o. Each of the stadium structures 422a through 422d and 422f through 422h may be at least partially defined by ends of an upper group 409a of the tiers 408 (e.g., tiers 408 positioned relatively higher in the Z-direction), and may serve as redundant and/or alternative means of connecting to the tiers 408 of the upper group 409a. The fifth stadium structure 422e may be at least partially defined by ends of a lower group 409b of the tiers 408 (e.g., tiers 408 positioned relatively lower in the Z-direction), and may serve as redundant and/or alternative means of connecting to the tiers 408 of the lower group 409b.

In additional embodiments, the conductive stack structure 426 may exhibit one or more of a different number and different configuration of staircase structures 420. By way of non-limiting example, the conductive stack structure 426 may include a different number (e.g., more or less) of stadium structures 422 associated with (e.g., at least partially defined by ends of) the upper group 409a of the tiers 408, may include one or more additional stadium structures 422 associated with the lower group 409b of the tiers 408, may include one or more additional stadium structures in series with one or more of the stadium structures 422, may include one or more forward staircase structures but not one or more reverse staircase structures, and/or may include one or more reverse staircase structures but not one or more forward staircase structures.

With continued reference to FIG. 4, the conductive stack structure 426 may include multiple (e.g., more than one) openings 418 therein. The openings 418 may longitudinally extend (e.g., in the Z-direction) through the conductive stack structure 426, may laterally intervene (e.g., in the Y-direction) between the staircase structures 420, and may continuously laterally extend (e.g., in the X-direction) across the entire lengths of the staircase structures 420. By way of non-limiting example, as shown in FIG. 4, the openings 418 may extend completely through each of the tiers 408, may be positioned laterally adjacent the stadium structures 422, and may continuously laterally extend across entire lengths of the stadium structures 422. A first opening 418a may be disposed between (e.g., in the Y-direction) and extend across (e.g., in the X-direction) entire lengths of the first stadium structure 422a and the second stadium structure 422b. A second opening 418b may extend in parallel with the first opening 418a, and may be disposed between and extend across entire lengths of the second stadium structure 422b and the third stadium structure 422c. A third opening 418c may extend in parallel with the first opening 418a, and may be disposed between and extend across entire lengths of the third stadium structure 422c and the fourth stadium structure 422d. A fourth opening 418d may extend in series with the first opening 418a, and may be disposed between and extend across entire lengths of the fifth stadium structure 422e and the sixth stadium structure 422f. A fifth opening 418e may extend in parallel with the fifth stadium structure 422e and series with the second opening 418b, and may be disposed between and extend across entire lengths of the sixth stadium structure 422f and the seventh stadium structure 422g. A sixth opening 418f may extend in parallel with the fifth stadium structure 422e and series with the third opening 418c, and may be disposed between and extend across entire lengths of the seventh stadium structure 422g and the eighth stadium structure 422h. In additional embodiments, the conductive stack structure 426 may include a different number of the openings 418 (e.g., less than six (6) openings 418, or more than six (6) openings 418).

As shown in FIG. 4, the conductive structures 428 may follow (e.g., route along) lateral (e.g., side) surfaces of the conductive stack structure 426. For example, the conductive structures 428 may extend into and along outer lateral surfaces (e.g., peripheral lateral surfaces) of the tiers 408, as well as into and along inner lateral surfaces of the tiers 408 (e.g., lateral surfaces at least partially defined by the openings 418 longitudinally extending through the tiers 408). The conductive structures 428 of the upper group 409a of the tiers 408 may laterally extend to and partially (e.g., incompletely) around the openings 418, and may at least partially define a portion of the staircase structures 420 of the conductive stack structure 326. For example, as shown in FIG. 4, one or more (e.g., each) tiers 408 of the upper group 409a of the tiers 408 may individually include multiple (e.g., more than one) conductive structures 428 that laterally extend to and partially around the openings 418, and that partially define the stadium structures 422a through 422d and 422f through 422h. The multiple conductive structures 428 of each of the tiers 408 defining the stadium structures 422a through 422d and 422f through 422h may form discontinuous (e.g., segmented) conductive paths between a first end 432 of the conductive stack structure 426 and a second, opposing end 434 of the conductive stack structure 426. The first end 432 and the second, opposing end 434 of the conductive stack structure 426 may each be coupled to other components of a semiconductor device (e.g., a memory device) including the semiconductor device structure 400, such as one or more memory cell arrays (e.g., vertical memory cell arrays). Each of the tiers 408 of the upper group 409a of the tiers 408 may include multiple (e.g., more than one) conductive structures 428, or at least one of the tiers 408 of the upper group 409a may include a single (e.g., only one) conductive structure 428. In addition, the conductive structures 428 of the lower group 409b of the tiers 408 may laterally extend to and completely around the openings 418, and may at least partially define another portion of the staircase structures 420 of the conductive stack structure 326. For example, as shown in FIG. 4, one or more (e.g., each) tiers 408 of the lower group 409b of the tiers 408 may individually include one or more conductive structures 428 that laterally extend to and completely around the openings 418, and that partially define the fifth stadium structure 422e. The one or more conductive structures 428 of each of the tiers 408 defining the fifth stadium structure 422e may form one or more continuous conductive paths between the first end 432 of the conductive stack structure 426 and the second, opposing end 434 of the conductive stack structure 426. Each of the tiers 408 of the lower group 409b of the tiers 408 may include single (e.g., only one) conductive structure 428, or at least one of the tiers 408 of the lower group 409b may include multiple (e.g., more than one) conductive structures 428.

With continued reference to FIG. 4, first conductive contact structures 436a (e.g., conductive plugs, conductive vertical interconnects) may be coupled (e.g., attached, connected) to at least a portion the conductive structures 428 of the upper group 409a of the tiers 408 at opposing steps 424 of one or more of the stadium structures 422. For example, for each of the tiers 408 of the upper group 409a of the tiers 408 defining the stadium structures 422a through 422d, at least one first conductive contact structure 436a may be coupled to at least one conductive structure 428 of the tier 408 at a step 424 of at least one forward staircase structure (e.g., one or more of the first forward staircase structure 420a, the second forward staircase structure 420c, the third forward staircase structure 420e, and the fourth forward staircase structure 420g), and at least one additional first conductive contact structure 436a may be coupled to at least one other conductive structure 428 of the tier 408 at an opposing step 424 of at least one reverse staircase structure (e.g., one or more of the first reverse staircase structure 420b, the second reverse staircase structure 420d, the third reverse staircase structure 420f, and the fourth reverse staircase structure 420h). In addition, for each of the tiers 408 of the upper group 409a of the tiers 408 defining the stadium structures 422f through 422h, at least one additional first conductive contact structure 436a may be coupled to at least one conductive structure 428 of the tier 408 at a step 424 of at least one forward staircase structure (e.g., one or more of the sixth forward staircase structure 420k, the seventh forward staircase structure 420m, and the eighth forward staircase structure 420o), and at least one further first conductive contact structure 436a may be coupled to at least one other conductive structure 428 of the tier 408 at an opposing step 424 of at least one reverse staircase structure (e.g., one or more of the sixth reverse staircase structure 420l, the seventh reverse staircase structure 420n, and the eighth reverse staircase structure 420p). By way of non-limiting example, as shown in FIG. 4, for each of the tiers 408 of the upper group 409a of the tiers 408 defining the stadium structures 422a through 422d and 422f through 422h, two (2) first conductive contact structures 436a may be coupled to conductive structures 428 of the tier 408 at opposing steps 424 of the fourth stadium structure 422d (e.g., opposing steps 424 of the fourth forward staircase structure 420g and the fourth reverse staircase structure 420h), and two (2) additional first conductive contact structures 436a may be coupled to conductive structures 428 of the tier 408 at opposing steps 424 of the eighth stadium structure 422h (e.g., opposing steps 424 of the eighth forward staircase structure 420o and the eighth reverse staircase structure 420p).

In addition, as shown in FIG. 4, second conductive contact structures 436b may be coupled (e.g., attached, connected) to at least a portion of the conductive structures 428 of each of the upper group 409a of the tiers 408 and the lower group of the tiers 408 at steps 424 of the stadium structures 422. For example, for each of the tiers 408 of the upper group 409a of the tiers 408 defining the stadium structures 422a through 422d and 422f through 422h at least one second conductive contact structure 436b may be coupled to at least one conductive structure 428 of the tier 408 at a step 424 of at least one of the stadium structures 422a through 422d and 422f through 422h. By way of non-limiting example, for each of the tiers 408 of the upper group 409a of the tiers 408 defining the stadium structures 422a through 422d and 422f through 422h, at least one second conductive contact structure 436b may be coupled to at least one conductive structure 428 of the tier 408 at one or more steps 424 of the first stadium structure 422a (e.g., a step 424 of the first forward staircase structure 420a, and/or a step 424 of the first reverse staircase structure 420b). In addition, for each of the tiers 408 of the lower group 409b defining the fifth stadium structure 422e at least one additional second conductive contact structure 436b may be coupled to at least one conductive structure 428 of the tier 408 at a step 424 of the fifth stadium structure 422e. By way of non-limiting example, for each of the tiers 408 of the lower group 409b of the tiers 408 defining the fifth stadium structure 422e, at least one second conductive contact structure 436b may be coupled to at least one conductive structure 428 of the tier 408 at one or more steps 424 of the fifth stadium structure 422e (e.g., a step 424 of fifth forward staircase structure 420i, and/or a step 424 of the fifth reverse staircase structure 420j).

With continued reference to FIG. 4, conductive routing structures 438 may be coupled (e.g., attached, connected) to and extend between the first conductive contact structures 436a. The conductive routing structures 438 may form conductive paths between (e.g., electrically connect) electrically isolated conductive structures 428 of the tiers 408 of the upper group 409a of the tiers 408. For each of the tiers 408 of the upper group 409a defining the stadium structures 422a through 422d and 422f through 422h, the combination of the first conductive contact structures 436a and the conductive routing structures 438 may electrically connect a least a portion of conductive structures 428 of the tier 408 to form a continuous conductive path extending from the first end 432 of the conductive stack structure 426 to the second, opposing end 434 of the conductive stack structure 426. For example, for each of the tiers 408 defining the stadium structures 422a through 422d, at least one conductive routing structure 438 may extend from at least one first conductive contact structure 436a located on or over a step 424 of at least one forward staircase structure (e.g., one or more of the first forward staircase structure 420a, the second forward staircase structure 420c, the third forward staircase structure 420e, and the fourth forward staircase structure 420g) to at least one other first conductive contact structure 436a positioned on or over a step 424 of at least one reverse staircase structure (e.g., one or more of the first reverse staircase structure 420b, the second reverse staircase structure 420d, the third reverse staircase structure 420f, and the fourth reverse staircase structure 420h). In addition, for each of the tiers 408 defining the stadium structures 422f through 422h, at least one conductive routing structure 438 may extend from at least one first conductive contact structure 436a positioned on or over a step 424 of at least one forward staircase structure (e.g., one or more of the sixth forward staircase structure 420k, the seventh forward staircase structure 420m, and the eighth forward staircase structure 420o) to at least one other first conductive contact structure 436a positioned on or over a step 424 of at least one reverse staircase structure (e.g., one or more of the sixth reverse staircase structure 420l, the seventh reverse staircase structure 420n, and the eighth reverse staircase structure 420p). By way of non-limiting example, as shown in FIG. 4, for each of the tiers 408 of the upper group 409a defining the stadium structures 422a through 422d and 422f through 422h, a conductive routing structure 438 may be coupled to the first conductive contact structures 436a located on or over opposing steps 424 of the fourth stadium structure 422d (e.g., on or over opposing steps 424 of the fourth forward staircase structure 420g and the fourth reverse staircase structure 420h), and another conductive routing structure 438 may be coupled to the first conductive contact structures 436a located on or over opposing steps 424 of the eighth stadium structure 422h (e.g., on or over opposing steps 424 of the eighth forward staircase structure 420o and the eighth reverse staircase structure 420p).

As previously described, tiers 408 (e.g., at least the lower group 409b of the tiers 408) of the conductive stack structure 426 longitudinally below the tiers 408 defining the stadium structures 422a through 422d and 422f through 422h may already exhibit continuous conductive paths extending from the first end 432 of the conductive stack structure 426 to the second, opposing end 434 of the conductive stack structure 426 due to the portions of the conductive structures 428 thereof that extend to and completely around the openings 418. Accordingly, with the use of the first conductive contact structures 436a and the conductive routing structures 438, each of the tiers 408 of the conductive stack structure 426 may exhibit at least one continuous conductive path extending from the first end 432 of the conductive stack structure 426 to the second, opposing end 434 of the conductive stack structure 426.

As shown in FIG. 4, additional conductive routing structures 440 may be coupled (e.g., attached, connected) to and extend between the second conductive contact structures 436b and at least one string driver device 442. The additional conductive routing structures 440 may form conductive paths between (e.g., electrically connect) the string driver device 442 and at least some of the conductive structures 428 of each of the upper group 409a of the tiers 408 and the lower group 409b of the tiers 408. For example, for each of the tiers 408 of the upper group 409a defining the stadium structures 422a through 422d and 422f through 422h, at least one additional conductive routing structure 440 may extend from at least one second conductive contact structure 436b located on or over a step 424 of one or more of the stadium structures 422a through 422d and 422f through 422h (e.g., a step 424 of one or more of the forward staircase structures 420a, 420c, 420e, 420g, 420k, 420m, and 420o, and/or a step 424 of one or more of the reverse staircase structures 420b, 420d, 420f, 420h, 420l, 420n, and 420p) to at least one of the string driver devices 442. In addition, for each of the tiers 408 of the lower group 409b defining the fifth stadium structure 422e, at least one other additional conductive routing structure 440 may extend from a step 424 of the fifth stadium structure 422e (e.g., a step 424 of the fifth forward staircase structure 420i, and/or a step 424 of the fifth reverse staircase structure 420j) to at least one of the string driver devices 442.

The conductive paths between the one or more string driver devices 442 and the conductive structures 428 of the tiers 408 provided by the second conductive contact structures 436b and additional conductive routing structures 440 may facilitate application of voltages to the conductive structures 428 using the string driver devices 442. In turn, the continuous conductive paths across the conductive stack structure 426 (e.g., from the first end 432 to the second, opposing end 434) provided by the configurations and positions of the conductive structures 428, the first conductive contact structures 436a, and the conductive routing structures 438 may permit an individual (e.g., single) switching device (e.g., transistor) of the string driver device 442 to drive voltages completely across (e.g., from the first end 432 to the second, opposing end 434) and/or in opposing directions across (e.g., toward the first end 432 and toward the second, opposing end 434) an individual tier 408 electrically connected thereto.

Figure 5:
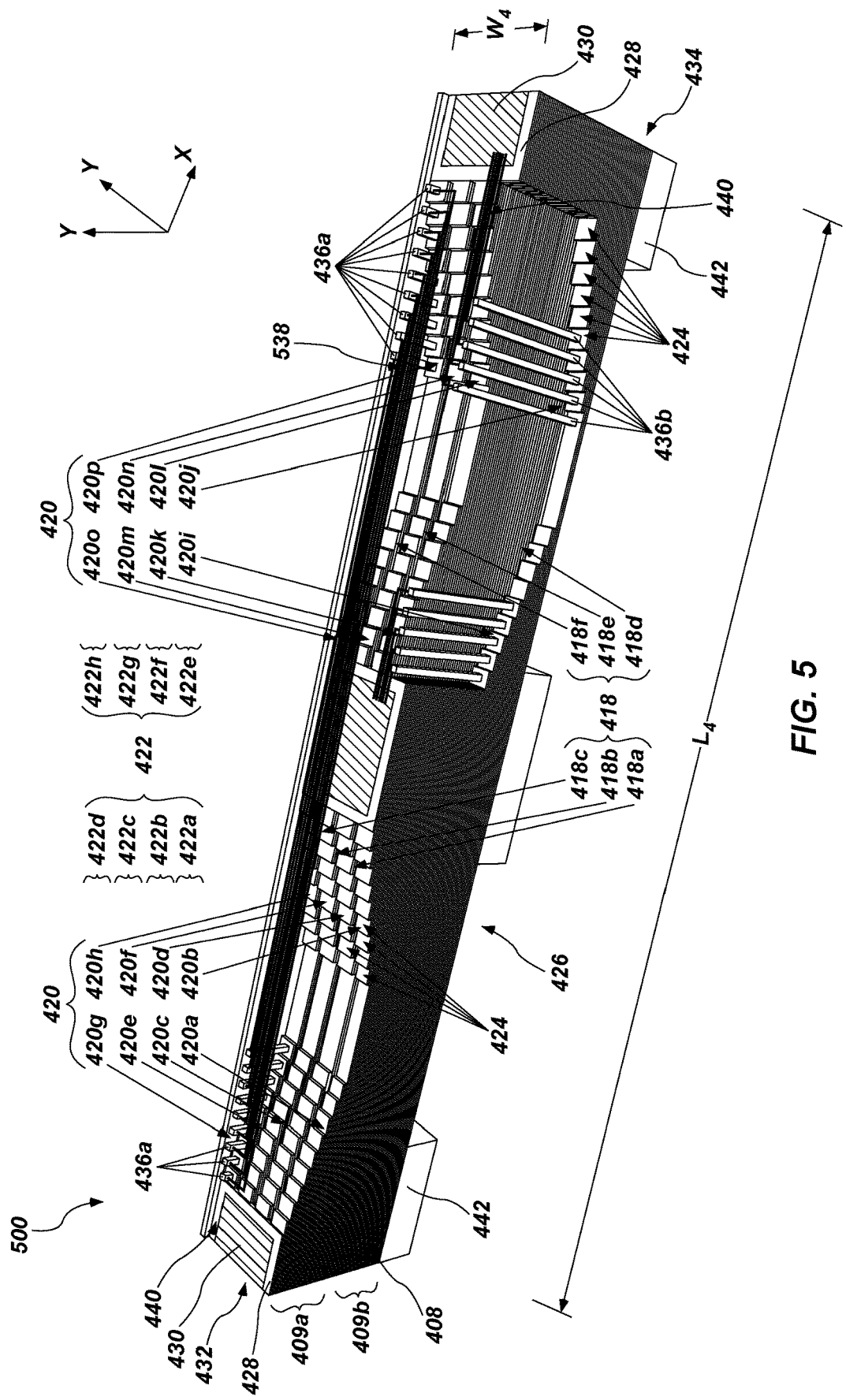
FIG. 5 is a perspective view of a semiconductor device structure, in accordance with further embodiments of the disclosure.

In additional embodiments, one or more of the conductive routing structures 438 and the additional conductive routing structures 440 may be configured and/or positioned differently than depicted in FIG. 4. By way of non-limiting example, FIG. 5 shows an embodiment of a semiconductor device structure 500 including conductive routing structures 538 exhibiting different configurations than the conductive routing structures 438 (FIG. 4). The semiconductor device structure 500 may be substantially similar to the semiconductor device structure 400, except for the conductive routing structures 538 and the associated positions of at least some of the first conductive contact structures 436a, the second conductive contact structures 436b, and the additional conductive routing structure 440.

As shown in FIG. 5, in contrast to the configurations and positions of the conductive routing structures 438 (FIG. 4), individual conductive routing structures 538 may be coupled to and extend between first conductive contact structures 436a located on or over steps 424 of different stadium structures 422. For one or more (e.g., each) of the tiers 408 of the upper group 409a defining the stadium structures 422a through 422d and 422f through 422h, one or more conductive routing structures 538 may individually electrically connect conductive structures 428 of different stadium structures 422 (e.g., stadium structures 422 positioned in series with one another) of the tier 408 to form a continuous conductive path extending from the first end 432 of the conductive stack structure 426 to the second, opposing end 434 of the conductive stack structure 426. For example, for each of the tiers 408 of the upper group 409*a* defining the stadium structures 422*a* through 422*d* and 422*f* through 422*h*, at least one conductive routing structure 538 may extend from at least one first conductive contact structure 436*a* located on or over a step 424 of one or more of the stadium structures 422*a* through 422*d* (e.g., a step 424 of one or more of the forward staircase structures 420*a*, 420*c*, 420*e*, and 420*g*, and/or a step 424 of one or more of the reverse staircase structures 420*b*, 420*d*, 420*f*, and 420*h*) to at least one other first conductive contact structure 436*a* located on or over a step 424 of one or more of the stadium structures 422*f* through 422*h* (e.g., a step 424 of one or more of the forward staircase structures 420*k*, 420*m*, and 420*o*, and/or a step 424 of one or more of the reverse staircase structures 420*l*, 420*n*, and 420*p*). By way of non-limiting example, as shown in FIG. 5, for each of the tiers 408 of the upper group 409*a* defining the stadium structures 422*a* through 422*d* and 422*f* through 422*h*, a conductive routing structure 438 may extend completely between a first conductive contact structure 436*a* located on or over a step 424 of the fourth stadium structure 422*d* (e.g., on or over a step 424 of the fourth forward staircase structure 420*g*, or on or over a step 424 of the fourth reverse staircase structure 420*h*) and another first conductive contact structure 436*a* located on or over a step 424 of the eighth stadium structure 422*h* (e.g., on or over a step 424 of the eighth forward staircase structure 420*o*, or on or over a step 424 of the eighth reverse staircase structure 420*p*).

In addition, as also shown in FIG. 5, optionally, at least one of the first conductive contact structures 436*a* located on or over the steps 424 of one or more of stadium structures 422 defined by the upper group 409*a* of the tiers 408 may be shared by at least one of the conductive routing structures 538 and at least one of the additional conductive routing structures 440. The additional conductive routing structure 440 may be coupled to and extend between to the first conductive contact structure 436*a* and at least one of the string driver devices 442. By way of non-limiting example, as depicted in FIG. 5, at least one of the first conductive contact structures 436*a* located on or over a step 424 of the fourth stadium structure 422*d* may be shared by at least one conductive routing structure 538 extending to at least one of the first conductive contact structures 436*a* located on or over a step 424 of the eighth stadium structure 422*h*, and at least one additional conductive routing structure 440 extending to at least one of the string driver devices 442. Alternative to, or in combination with, sharing one or more of the first conductive contact structures 436*a* between the at least one of the conductive routing structures 538 and at least one of the additional conductive routing structures 440, one or more of the tiers 408 of the upper group 409*a* may be electrically connected to one or more of the string driver devices 442 in the manner previously described above in relation to FIG. 4.

Similar to the configuration of the semiconductor device structure 400 (FIG. 4), the configuration of the semiconductor device structure 500 may permit individual switching devices (e.g., individual transistors) of the string driver devices 442 to drive voltages completely across (e.g., from the first end 432 to the second, opposing end 434) and/or in opposing directions across (e.g., toward the first end 432 and toward the second, opposing end 434) individual tiers 408 of the conductive stack structure 426 electrically connected thereto.

Figure 6:
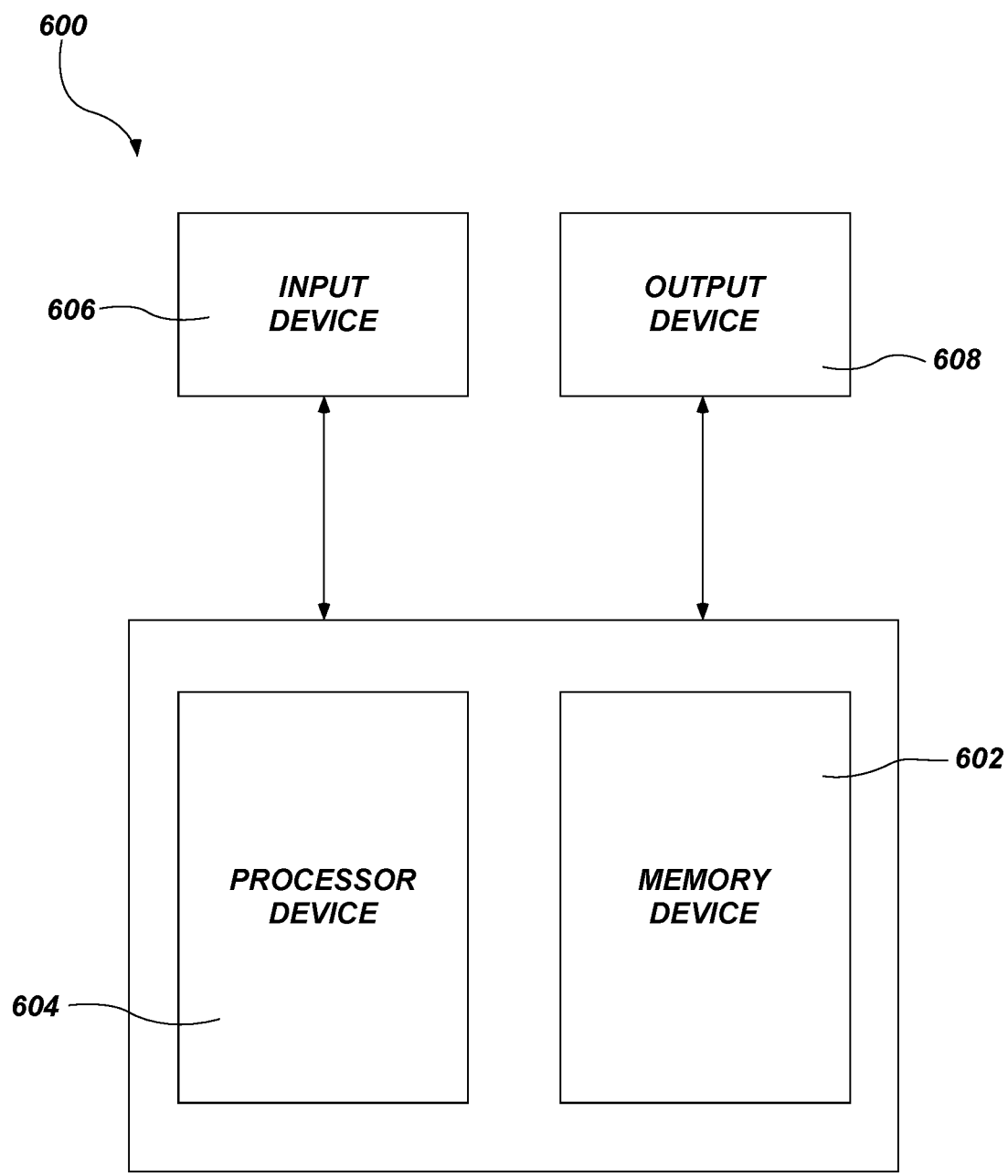
FIG. 6 is a schematic block diagram illustrating an electronic system in accordance with embodiments of the disclosure.

Semiconductor devices (e.g., memory devices, such as 3D NAND Flash memory device) including one or more of the semiconductor device structures 100, 200, 300, 400, 500 in accordance with embodiments of the disclosure may be used in embodiments of electronic systems of the disclosure. For example, FIG. 6 is a block diagram of an illustrative electronic system 600 according to embodiments of disclosure. The electronic system 600 may comprise, for example, a computer or computer hardware component, a server or other networking hardware component, a cellular telephone, a digital camera, a personal digital assistant (PDA), portable media (e.g., music) player, a WiFi or cellular-enabled tablet such as, for example, an iPad® or SURFACE® tablet, an electronic book, a navigation device, etc. The electronic system 600 includes at least one memory device 602. The at least one memory device 602 may include, for example, an embodiment of one or more of the semiconductor device structures 100, 200, 300, 400, 500 shown in FIGS. 1A through 5 (i.e., including FIGS. 1A through 1G, 2, 3A through 3F, 4, and 5). The electronic system 600 may further include at least one electronic signal processor device 604 (often referred to as a "microprocessor"). The electronic signal processor device 604 may, optionally, include a semiconductor device structure substantially similar to an embodiment of one or more of the semiconductor device structures 100, 200, 300, 400, 500 shown in FIGS. 1A through 5 (i.e., including FIGS. 1A through 1G, 2, 3A through 3F, 4, and 5). The electronic system 600 may further include one or more input devices 606 for inputting information into the electronic system 600 by a user, such as, for example, a mouse or other pointing device, a keyboard, a touchpad, a button, or a control panel. The electronic system 600 may further include one or more output devices 608 for outputting information (e.g., visual or audio output) to a user such as, for example, a monitor, a display, a printer, an audio output jack, a speaker, etc. In some embodiments, the input device 606 and the output device 608 may comprise a single touch screen device that can be used both to input information to the electronic system 600 and to output visual information to a user. The one or more input devices 606 and output devices 608 may communicate electrically with at least one of the memory device 602 and the electronic signal processor device 604.

Thus, in accordance with embodiments of the disclosure, an electronic system comprises at least one semiconductor device structure comprising stacked tiers each comprising at least one conductive structure and at least one insulating structure longitudinally adjacent the at least one conductive structure; at least one stadium structure comprising opposing staircase structures having steps comprising lateral ends of the stacked tiers; at least one opening laterally adjacent the stadium structures, the at least one opening extending through the stacked tiers and continuously across an entire length of the at least one stadium structure; and at least one continuous conductive path at least partially formed by the at least one conductive structure of each of the stacked tiers and extending across an entire length of each of the stacked tiers.

The methods and structures of the disclosure may decrease the number of switching devices and interconnections required to drive voltages completely across and/or in different directions across a conductive structure of a tier as compared to conventional methods and structures associated with various semiconductor devices (e.g., memory devices, such as 3D NAND Flash memory). The methods and structures of the disclosure may permit a single switching device to drive an access line (e.g., word line) of a memory cell array from a more centralized (e.g., middle, non-edge) location, which may reduce resistance x current (RC) delay by one-fourth (¼) as compared to conventional methods and structures. The methods and structures of the disclosure may also reduce costs (e.g., manufacturing costs, material costs) and performance, scalability, efficiency, and simplicity as compared to conventional structures and methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent

What is claimed is:

1. A method of forming a semiconductor device structure, comprising:
    forming a stack structure comprising stacked tiers each comprising an insulating structure and an additional insulating structure longitudinally adjacent the insulating structure;
    removing portions of the stacked tiers of the stack structure to form multiple stadium structures each comprising opposing staircase structures having steps comprising lateral ends of the stacked tiers, the multiple stadium structures extending in parallel with one another in a first lateral direction and separated from one another in a second lateral direction by openings longitudinally extending through the stacked tiers and laterally extending continuously across entire lengths of the multiple stadium structures in the first lateral direction;
    replacing portions of the additional insulating structure of each of the stacked tiers with at least one conductive material to form at least one conductive structure in each of the stacked tiers;
    forming additional conductive structures extending from and between corresponding steps of the opposing staircase structures of a first stadium structure of the multiple stadium structures; and
    forming further conductive structures extending from the steps of at least one of the opposing staircase structures of a second stadium structure of the multiple stadium structures to at least one string driver device, portions of the at least one conductive structure of an individual tier of the stacked tiers within boundaries of the first stadium structure connected to additional portions of the at least one conductive structure of the individual tier of the stacked tiers within boundaries of the second stadium structure.

2. The method of claim 1, wherein replacing portions of the additional insulating structure of each of the stacked tiers with at least one conductive material comprises:
    removing the portions of the additional insulating structure proximate lateral surfaces of the stacked tiers to form recessed regions laterally extending into each of the stacked tiers; and
    filling the recessed regions with the at least one conductive material.

3. The method of claim 1, wherein the string driver device vertically underlies the multiple stadium structures.

4. A method of forming a semiconductor device structure, comprising:
    forming a stack structure comprising stacked tiers each comprising an insulating structure and an additional insulating structure longitudinally adjacent the insulating structure;
    removing portions of the stacked tiers of the stack structure to form at least one stadium structure comprising opposing staircase structures;
    forming at least one opening extending through the stacked tiers and continuously across an entire length of the at least one stadium structure to form additional stadium structures each comprising additional opposing staircase structures having steps comprising lateral ends of the stacked tiers;
    replacing portions of the additional insulating structure of each of the stacked tiers with at least one conductive material to form conductive structures in each of the stacked tiers;
    coupling first conductive contact structures to the conductive structures of the stacked tiers at steps of a first of the additional opposing staircase structures of a first additional stadium structure of the additional stadium structures, each of the first conductive contact structures having a different longitudinal length than each other of the first conductive contact structures;
    coupling second conductive contact structures to the conductive structures of the stacked tiers at the steps of a second of the additional opposing staircase structures of the first additional stadium structure, each of the second conductive contact structures having a different longitudinal length than each other of the second conductive contact structures;
    coupling conductive routing structures to and completely between corresponding first conductive contact structures and second conductive contact structures to form at least one continuous conductive path extending completely across each of the stacked tiers; and
    forming additional conductive structures extending from the steps of at least one of the additional opposing staircase structures of a second additional stadium structure of the additional stadium structures to at least one string driver device, one of the conductive structures of an individual tier of the stacked tiers within boundaries of the first additional stadium structure connected to one other of the conductive structures of the individual tier of the stacked tiers within boundaries of the second additional stadium structure.

5. The method of claim 4, further comprising coupling additional conductive routing structures to and completely between at least one string driver device and third conductive contact structures coupled to the steps of at least one of the additional opposing staircase structures of one other of the additional stadium structures.

6. The method of claim 4, wherein forming at least one opening comprises forming at least two parallel openings extending through the stacked tiers and continuously across the entire length of the at least one stadium structure.

7. The method of claim 4, wherein coupling first conductive contact structures to the conductive structures of the stacked tiers comprises forming upper ends of the first conductive contact structures to be substantially coplanar with one another.

8. The method of claim 7, wherein coupling second conductive contact structures to the conductive structures of the stacked tiers comprises coupling forming upper ends of the second conductive contact structures to be substantially coplanar with one another and the upper ends of the first conductive contact structures.

* * * * *